United States Patent
Kodama et al.

(10) Patent No.: US 6,265,135 B1
(45) Date of Patent: Jul. 24, 2001

(54) POSITIVE-WORKING ELECTRON BEAM OR X-RAY RESIST COMPOSITION

(75) Inventors: Kunihiko Kodama; Toshiaki Aoai; Kazuya Uenishi, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/419,905

(22) Filed: Oct. 18, 1999

(30) Foreign Application Priority Data

Oct. 16, 1998 (JP) .................................................. 10-295609
Sep. 28, 1999 (JP) .................................................. 11-275334

(51) Int. Cl.⁷ .......................... G03C 1/492; C03F 12/08; C08F 12/24
(52) U.S. Cl. .................................... 430/286.1; 430/270.1; 430/296; 430/966; 430/942; 430/281.1
(58) Field of Search .................. 430/270.1, 157, 430/165, 171, 281.1, 286.1, 296, 905, 917, 966, 942

(56) References Cited

U.S. PATENT DOCUMENTS

| | | | |
|---|---|---|---|
| 5,314,786 | * | 5/1994 | Roeschert et al. ................ 430/270.1 |
| 5,629,134 | * | 5/1997 | Oikawa et al. .................... 430/270.1 |
| 6,027,854 | * | 2/2000 | Nishi et al. ........................ 430/270.1 |
| 6,033,828 | * | 3/2000 | Shimada et al. ................ 430/270.11 |
| 6,060,213 | * | 5/2000 | Kodoma ............................ 430/270.1 |

* cited by examiner

*Primary Examiner*—Janet Baxter
*Assistant Examiner*—Yvette M. Clarke
(74) *Attorney, Agent, or Firm*—Sughrue, Mion, Zinn, Macpeak & Seas, PLLC

(57) ABSTRACT

A positive-working electron beam or X-ray resist composition comprising:

(a) a compound capable of generating an acid by irradiation of an electron beam or X-ray;

(b) a resin containing a group which is decomposable by action of an acid to increase solubility in an alkali developing solution or (e) a resin insoluble in water and soluble in the alkali developing solution; and (c) a fluorine and/or silicon surfactant, the compound capable of generating an acid by irradiation of an electron beam or X-ray being a compound which generates benzenesulfonic acid, naphthalenesulfonic acid or anthracenesulfonic acid which is substituted by at least one fluorine atom and/or at least one group containing a fluorine atom.

10 Claims, No Drawings

POSITIVE-WORKING ELECTRON BEAM OR X-RAY RESIST COMPOSITION

FIELD OF THE INVENTION

The present invention relates to a positive-working electron beam or X-ray resist composition, and particularly to a positive-working electron beam or X-ray resist composition excellent in a pattern profile obtained by exposure to an electron beam or X-ray and having a small number of development defects.

BACKGROUND OF THE INVENTION

In i-line resists, KrF excimer laser resists and ArF excimer laser resists, bottom portions of the resists become lower in exposure than exposed surfaces thereof, because the resists have absorption at exposure wavelengths. In the case of positive-working resists, therefore, a pattern profile called a "taper form" is generally formed.

In the case of electron beam resist or X-ray resist, however, incident electron or X-ray has a charge, and interacts with atomic nuclei and electrons of substances constituting the resists, so that the incidence of an electron beam or X-ray into a resist film is necessarily accompanied by scattering. Accordingly, with respect to an exposed area, the bottom portion becomes larger in exposure area than the surface of the resist film. For this reason, the positive-working resist has the problem that a pattern profile called a "reverse taper form" is formed.

Further, even when exposure is carried out with reduced beam diameter for resolving a fine pattern, the scattering widens the exposure area to thereby deteriorate the resolution.

Furthermore, with recent miniaturization of processed patterns, development defects have posed a serious problem, and resists having less development defects have been desired.

Furthermore, the conventional resists have a low sensitivity, which causes a problem of so-called "throughput" in the production of integrated circuits. From this standpoint, a resist having a high sensitivity as compared with the conventional electron beam or X-ray resists has been desired.

SUMMARY OF THE INVENTION

An object of the present invention is to provide a positive-working electron beam or X-ray resist composition which has high resolution, can give a rectangular excellent pattern profile, and is improved in development defects.

According to the present invention, the following positive-working electron beam or X-ray resist composition is provided, and the above-mentioned object of the present invention is attained.

1. A positive-working electron beam resist composition comprising:

(a) a compound capable of generating an acid by irradiation of an electron beam;

(b) a resin containing a group which is decomposable by action of an acid to increase solubility in an alkali developing solution; and (c) a fluorine and/or silicon surfactant, the compound capable of generating an acid by irradiation of an electron beam being a compound which generates benzenesulfonic acid, naphthalenesulfonic acid or anthracenesulfonic acid which is substituted by at least one fluorine atom and/or at least one group containing a fluorine atom.

2. A positive-working X-ray resist composition comprising:

(a) a compound capable of generating an acid by irradiation of an X-ray;

(b) a resin containing a group which is decomposed by action of an acid to increase solubility in an alkali developing solution; and (c) a fluorine and/or silicon surfactant, the compound capable of generating an acid by irradiation of an X-ray being a compound which generates benzenesulfonic acid, naphthalenesulfonic acid or anthracenesulfonic acid which is substituted by at least one fluorine atom and/or at least one group containing a fluorine atom.

3. The positive-working electron beam or X-ray resist composition of the above item 1 or 2, which further comprises (d) a low molecular weight dissolution inhibitive compound having a molecular weight of 3,000 or less which has a group decomposable with an acid and increases the rate of dissolution in the alkali developing solution by action of an acid.

4. A positive-working electron beam resist composition comprising:

(a) a compound capable of generating an acid by irradiation of an electron beam;

(c) a fluorine and/or silicon surfactant;

(d) a low molecular weight dissolution inhibitive compound having a molecular weight of 3,000 or less which has a group decomposable with an acid and increases the rate of dissolution in an alkali developing solution by action of the acid; and (e) a resin insoluble in water and soluble in the alkali developing solution, the compound capable of generating an acid by irradiation of an electron beam (component (a)) being a compound which generates benzenesulfonic acid, naphthalenesulfonic acid or anthracenesulfonic acid which is substituted by at least one fluorine atom and/or at least one group containing a fluorine atom.

5. A positive-working electron beam resist composition comprising:

(a) a compound capable of generating an acid by irradiation of an electron beam;

(c) a fluorine and/or silicon surfactant;

(d) a low molecular weight dissolution inhibitive compound having a molecular weight of 3,000 or less which has a group decomposable with an acid and increases the rate of dissolution in an alkali developing solution by action of the acid; and (e) a resin insoluble in water and soluble in the alkali developing solution, the compound capable of generating an acid by irradiation of an electron beam (component (a)) being a compound which generates benzenesulfonic acid, naphthalenesulfonic acid or anthracenesulfonic acid which is substituted by at least one fluorine atom and/or at least one group containing a fluorine atom.

6. The positive-working electron beam or X-ray resist compositions of the above items 1 to 5, wherein the compound capable of generating an acid by irradiation of an electron beam or X-ray (component (a)) is at least one compound selected from the group consisting of compounds represented by formulae (I) to (III) which generate an acid by irradiation of an X-ray:

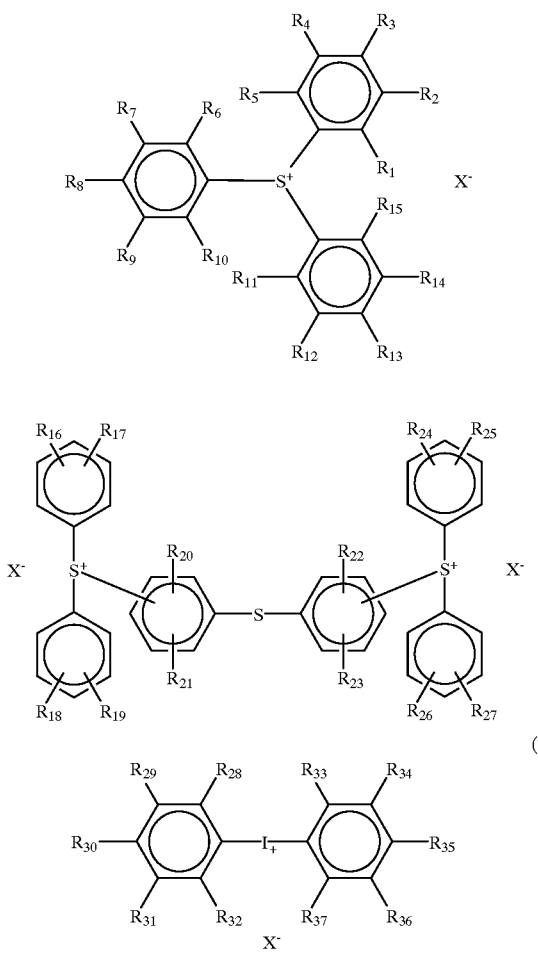

wherein $R_1$ to $R_{37}$, which may be the same or different, each represents a hydrogen atom, a straight-chain, branched or cyclic alkyl group, a straight-chain, branched or cyclic alkoxyl group, a hydroxyl group, a halogen atom or —S—$R_{38}$, wherein $R_{38}$ represents a straight-chain, branched or cyclic alkyl group or an aryl group, and two or more of $R_1$ to $R_{15}$, $R_{16}$ to $R_{27}$ or $R_{28}$ to $R_{37}$ may combine to form a ring containing one or two or more selected from the group consisting of a single bond, carbon, oxygen, sulfur and nitrogen; and $X^-$ represents an anion of benzenesulfonic acid, naphthalenesulfonic acid or anthracenesulfonic acid containing at least one selected from the group consisting of at least one fluorine atom, a straight-chain, branched or cyclic alkyl group substituted by at least one fluorine atom, a straight-chain, branched or cyclic alkoxyl group substituted by at least one fluorine atom, an acyl group substituted by at least one fluorine atom, an acyloxy group substituted by at least one fluorine atom, an alkyl or aryl sulfonyl group substituted by at least one fluorine atom, an alkyl or aryl sulfonyloxy group substituted by at least one fluorine atom, an alkyl or aryl sulfonylamino group substituted by at least one fluorine atom, an aryl group substituted by at least one fluorine atom, an aralkyl group substituted by at least one fluorine atom, and an alkoxycarbonyl group substituted by at least one fluorine atom.

DETAILED DESCRIPTION OF THE INVENTION

The positive-working electron beam or X-ray resist compositions of the present invention will be described in detail below.

[1] (a) Compounds Represented by General Formulae (I) to (III) (also Hereinafter Referred to as "Component (a)")

Component (a) is a compound which generates an acid by irradiation of an electron beam or X-ray, preferably a compound which generates, by irradiation of an electron beam or X-ray, benzenesulfonic acid, naphthalenesulfonic acid or anthracenesulfonic acid which is substituted by at least one fluorine atom and/or at least one group containing at least one fluorine atom, more preferably the compounds represented by formulae (I) to (III).

In general formulae (I) to (III) representing component (a), examples of the straight-chain or branched alkyl group as $R_1$ to $R_{38}$ include those having 1 to 4 carbon atoms such as methyl, ethyl, propyl, n-butyl, sec-butyl and t-butyl, which may have substituent(s). Examples of the cyclic alkyl group include those having 3 to 8 carbon atoms such as cyclopropyl, cyclopentyl and cyclohexyl, which may have substituent(s). Examples of the straight-chain or branched alkoxyl group as $R_1$ to $R_{38}$ include those having 1 to 4 carbon atoms such as methoxy, ethoxy, hydroxyethoxy, propoxy, n-butoxy, isobutoxy, sec-butoxy and t-butoxy, which may have substituent(s) Examples of the cyclic alkoxyl group as RK to $R_{38}$ include a cyclic alkoxy group which may have substituent(s), such as cyclopentyloxy and cyclohexyloxy.

The halogen atom as $R_1$ to $R_{38}$ include fluorine, chlorine, bromine and iodine.

Examples of the aryl group as $R_{38}$ include those having 6 to 14 carbon atoms such as phenyl, tolyl, methoxyphenyl and naphthyl, which may have substituent(s).

Preferred examples of the substituent which $R_1$ to $R_{38}$ may have include an alkoxyl group having 1 to 4 carbon atoms, a halogen atom (fluorine, chlorine and iodine), an aryl group having 6 to 10 carbon atoms, an alkenyl group having 2 to 6 carbon atoms, a cyano group, a hydroxyl group, a carboxyl group, an alkoxycarbonyl group and a nitro group.

Further, examples of the ring containing one or two or more selected from the group consisting of a single bond, carbon, oxygen, sulfur and nitrogen, which can be formed by combining two or more of $R_1$ to $R_{15}$, $R_{16}$ to $R_{27}$ or $R_{28}$ to $R_{37}$, include furan, dihydrofuran, pyran, trihydropyran, thiophene and pyrrole rings.

In general formulae (I) to (III), $X^-$ is an anion of benzenesulfonic acid, naphthalenesulfonic acid or anthracenesulfonic acid containing at least one selected from the following groups:

At least one fluorine atom;

A straight chain, branched or cyclic alkyl group substituted by at least one fluorine atom;

A straight chain, branched or cyclic alkoxyl group substituted by at least one fluorine atom;

An acyl group substituted by at least one fluorine atom;

An acyloxy group substituted by at least one fluorine atom;

An alkyl or aryl sulfonyl group substituted by at least one fluorine atom;

An alkyl or aryl sulfonyloxy group substituted by at least one fluorine atom;

An alkyl or aryl sulfonylamino group substituted by at least one fluorine atom;

An aryl group substituted by at least one fluorine atom;

An aralkyl group substituted by at least one fluorine atom; and

An alkoxycarbonyl group substituted by at least one fluorine atom.

The above-mentioned straight chain, branched or cyclic alkyl groups are preferably ones each having 1 to 12 carbon atoms and substituted by 1 to 25 fluorine atoms. Specific examples thereof include fluoromethyl, difluoromethyl, trifluoromethyl, pentafluoroethyl, 2,2,2-trifluoroethyl, heptafluoropropyl, heptafluoroiso-propyl, perfluorobutyl, perfluorooctyl, perfluorododecyl and perfluorocyclohexyl groups. Perfluoroalkyl groups each having 1 to 4 carbon atoms and wholly substituted by fluorine are preferred among others.

The above-mentioned straight chain, branched or cyclic alkoxyl groups are preferably ones each having 1 to 12 carbon atoms and substituted by 1 to 25 fluorine atoms. Specific examples thereof include trifluoromethoxy, pentafluoroethoxy, heptafluoroisopropyloxy, perfluorobutoxy, perfluorooctyloxy, perfluorododecyloxy and perfluorocyclohexyloxy groups. Perfluoroalkoxyl groups each having 1 to 4 carbon atoms and wholly substituted by fluorine are preferred among others.

The above-mentioned acyl groups are preferably ones each having 2 to 12 carbon atoms and substituted by 1 to 23 fluorine atoms. Specific examples thereof include trifluoroacetyl, fluoroacetyl, pentafluoropropionyl and pentafluorobenzoyl groups.

The above-mentioned acyloxy groups are preferably ones each having 2 to 12 carbon atoms and substituted by 1 to 23 fluorine atoms. Specific examples thereof include trifluoroacetoxy, fluoroacetoxy, pentafluoropropionyloxy and pentafluorobenzoyloxy groups.

The above-mentioned alkyl- or aryl-sulfonyl groups are preferably ones each having 1 to 12 carbon atoms and substituted by 1 to 25 fluorine atoms. Specific examples thereof include tri-fluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

The above-mentioned alkyl- or aryl-sulfonyloxy groups are preferably ones each having 1 to 12 carbon atoms and substituted by 1 to 25 fluorine atoms. Specific examples thereof include tri-fluoromethanesulfonyloxy, perfluorobutanesulfonyloxy, and 4-trifluoromethylbenzenesulfonyloxy groups.

The above-mentioned alkyl- or aryl-sulfonylamino groups are preferably ones each having 1 to 12 carbon atoms and substituted by 1 to 25 fluorine atoms. Specific examples thereof include tri-fluoromethanesulfonylamino, perfluorobutanesulfonylamino, perfluorooctanesulfonylamino and pentafluorobenzene-sulfonylamino groups.

The above-mentioned aryl groups are preferably ones each having 6 to 14 carbon atoms and substituted by 1 to 9 fluorine atoms. Specific examples thereof include pentafluorophenyl, 4-trifluoromethylphenyl, heptafluoronaphthyl, nonafluoroanthranil, 4-fluorophenyl and 2,4-difluorophenyl groups.

The above-mentioned aralkyl groups are preferably ones each having 7 to 10 carbon atoms and substituted by 1 to 15 fluorine atoms. Specific examples thereof include pentafluorophenylmethyl, pentafluorophenylethyl, perfluorobenzyl and perfluorophenethyl groups.

The above-mentioned alkoxycarbonyl groups are preferably ones each having 2 to 13 carbon atoms and substituted by 1 to 25 fluorine atoms. Specific examples thereof include trifluoromethoxycarbonyl, pentafluoroethoxycarbonyl, pentafluorophenoxycarbonyl, perfluorobutoxycarbonyl and perfluorooctyloxycarbonyl groups.

$X^-$ is most preferably a fluorine-substituted benzenesulfonic acid anion, and a pentafluorobenzenesulfonic acid anion is particularly preferred among others.

Further, benzenesulfonic acid, naphthalenesulfonic acid or anthracenesulfonic acid containing the above-mentioned fluorine-containing group may be further substituted by a straight-chain, branched or cyclic alkoxyl group, an acyl group, an acyloxy group, a sulfonyl group, a sulfonyloxy group, a sulfonylamino group, an aryl group, an aralkyl group, an alkoxycarbonyl group (the carbon number ranges of these groups are similar to those described above), halogen (excluding fluorine), hydroxyl or nitro.

Specific examples of component (a) represented by general formula (I) are shown below.

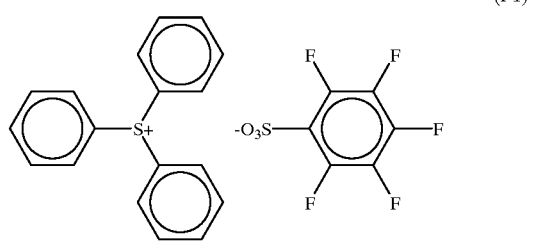

(I-1)

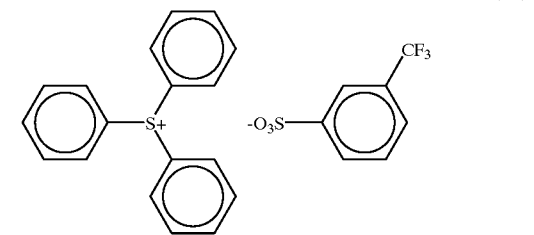

(I-2)

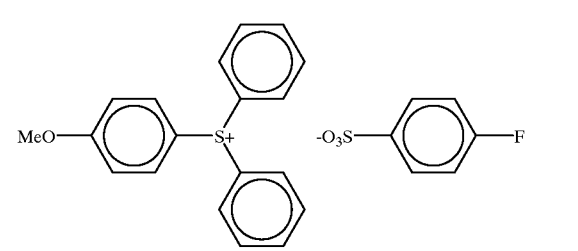

(I-3)

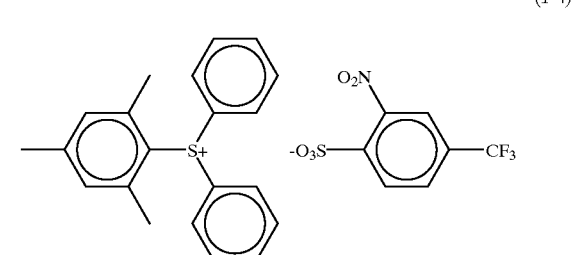

(I-4)

(I-5) 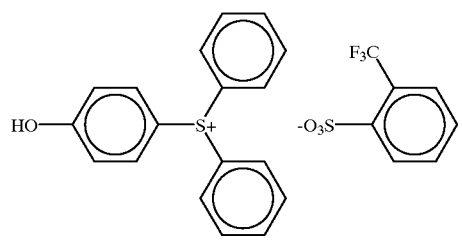
(I-6) 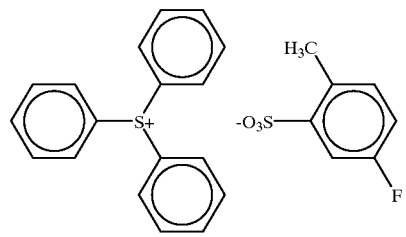
(I-7) 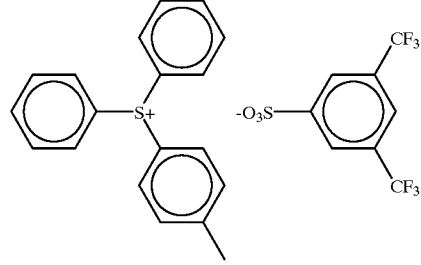
(I-8) 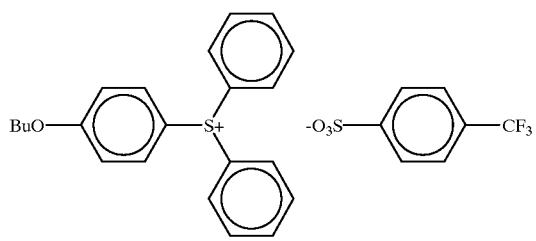
(I-9) 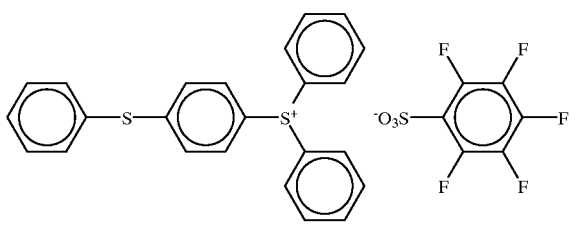
(I-10) 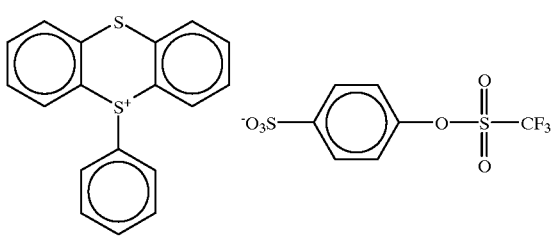
(I-11) 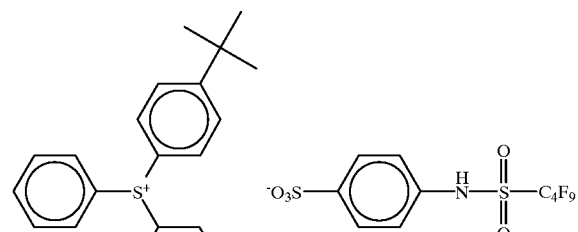
(I-12) 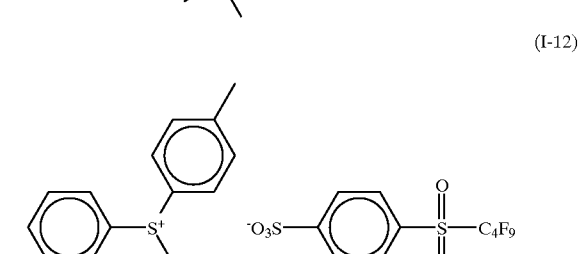
(I-13) 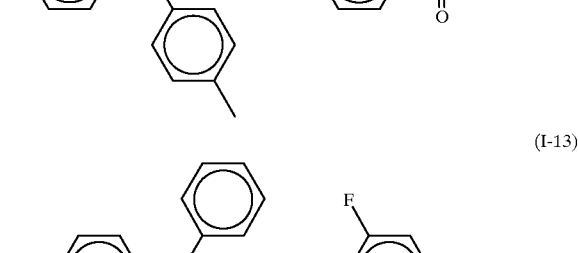
(I-14) 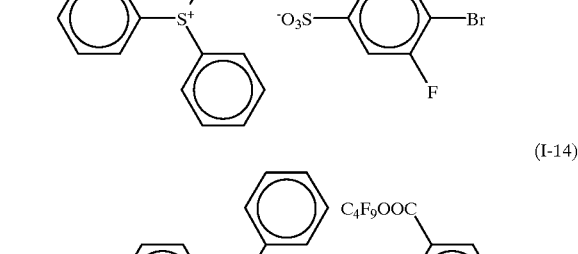
(I-15) 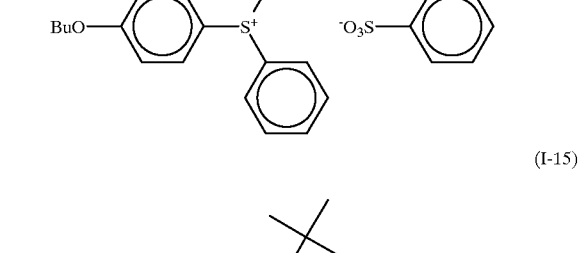

Specific examples of component (a) represented by general formula (II) are shown below.
(II-1)
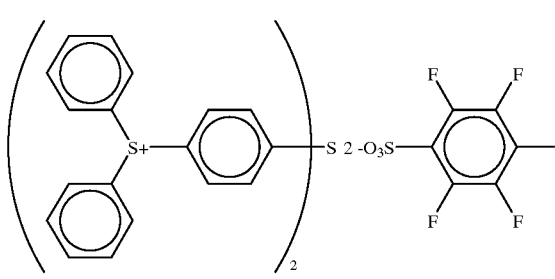
(II-2)
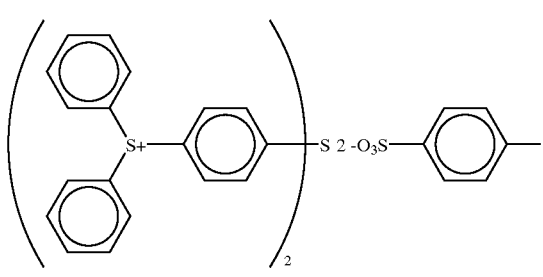
(II-3)
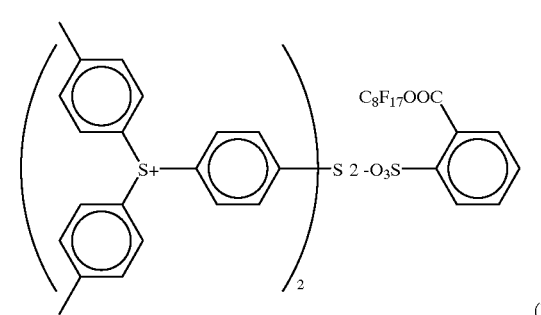
(II-4)
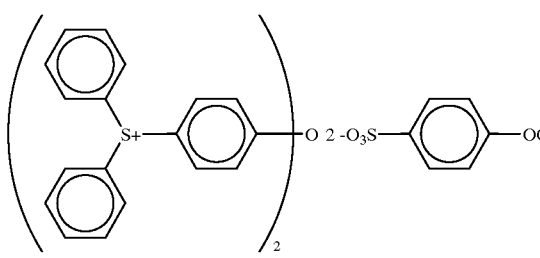
(II-5)
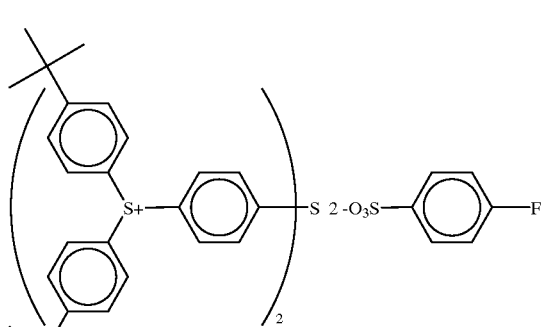
Specific examples of component (a) represented by general formula (III) are shown below.
(III-1)
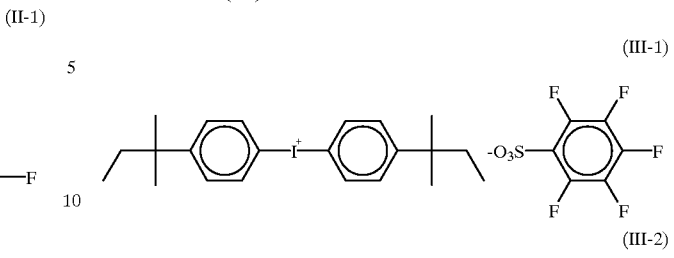
(III-2)
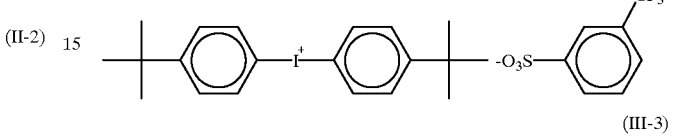
(III-3)
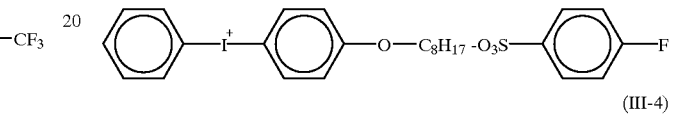
(III-4)
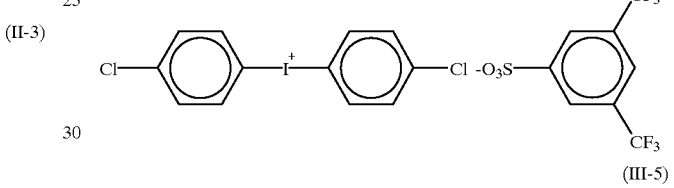
(III-5)
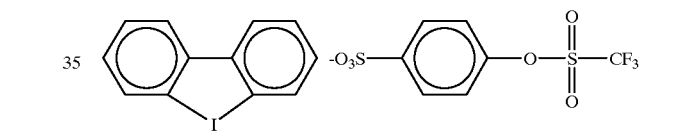
(III-6)
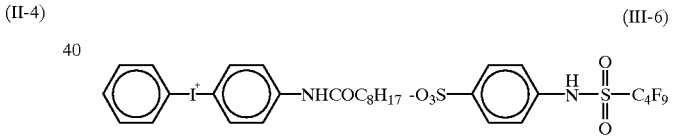
(III-7)
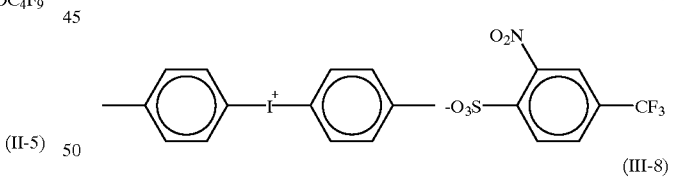
(III-8)
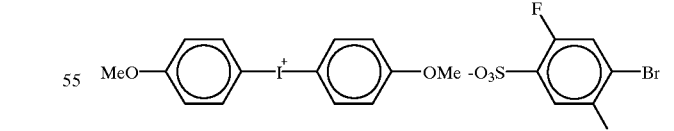
Furthermore, the compounds represented by formulae (IV) to (VII) are preferred as component (a).
(IV)
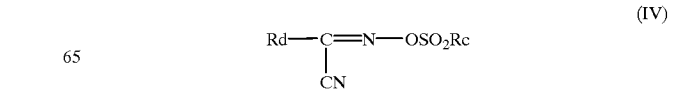

-continued

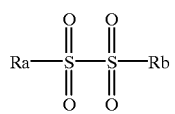
(V)

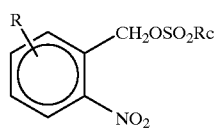
(VI)

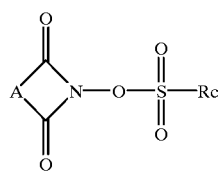
(VII)

In the above formulae,

Ra and Rb, which may be the same or different, each represents a straight chain, branched or cyclic alkyl group (preferably having 1 to 12 carbon atoms) which may be substituted, an aryl group (preferably having 6 to 14 carbon atoms) which may be substituted, a heteroaryl group (preferably having 4 to 13 carbon atoms) which may be substituted, or an aralkyl group (preferably having 7 to 13 carbon atoms) which may be substituted, with the proviso that at least one of Ra and Rb represents a phenyl, nephthyl, or anthracenyl group substituted by a fluorine atom or a group containing at least one fluorine atom, Rc represents a phenyl, nephthyl, or anthracenyl group substituted by a fluorine atom or a group containing at least one fluorine atom, Rd represents a straight chain, branched or cyclic alkyl (preferably having 1 to 12 carbon atoms) which may be substituted, an aryl group (preferably having 6 to 14 carbon atoms) which maybe substituted, aheteroaryl group (preferably having 4 to 13 carbon atoms) which may be substituted, or an aralkyl group (preferably having 7 to 13 carbon atoms) which may be substituted, R represents a hydrogen atom, a straight chain, branched or cyclic alkyl (preferably having 1 to 12 carbon atoms) which may be substituted, a nitro group, or an alkoxy group (preferably having 2 to 12 carbon atoms) which may be substituted, and A represents a substituted or unsubstituted alkylene (preferably having 2 to 10 carbon atoms), arylene (preferably having 6 to 14 carbon atoms), or alkenylene (preferably having 2 to 10 carbon atoms).

Preferred examples of the substituent which the groups represented by Ra to Rd, R and A may have include an alkoxyl group having 1 to 4 carbon atoms, a halogen atom (fluorine, chlorine and iodine), an aryl group having 6 to 10 carbon atoms, an alkenyl group having 2 to 6 carbon atoms, a cyano group, a hydroxyl group, a carboxyl group, an alkoxycarbonyl group and a nitro group.

Examples of the compounds represented by formulae (IV) to (VII) are shown below.

(IV-1)
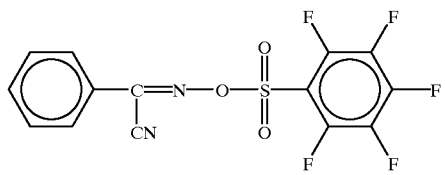

(IV-2)
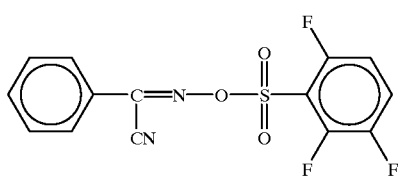

(IV-3)
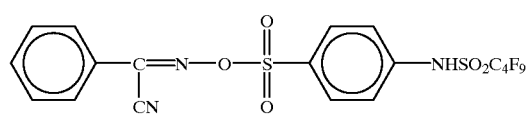

(IV-4)
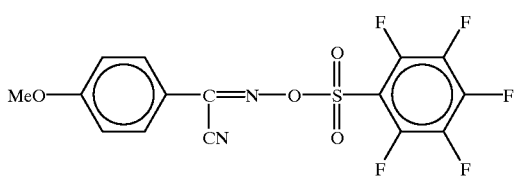

(V-1)
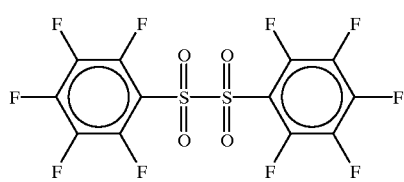

(V-2)
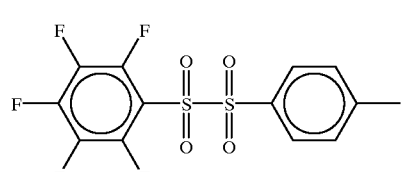

(V-3)
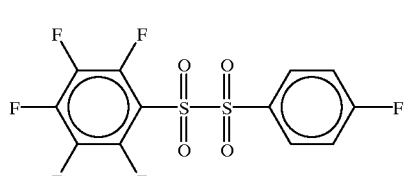

(V-4)
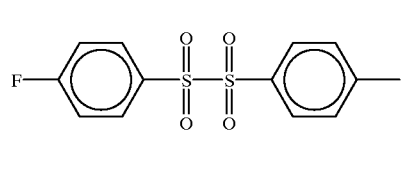

(V-5)
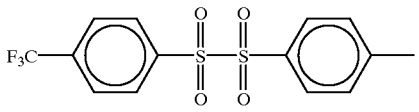

-continued
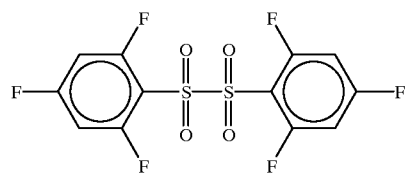 (V-6)
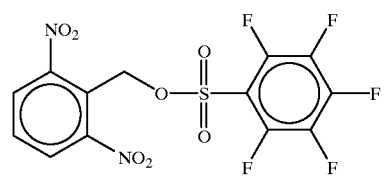 (VI-1)
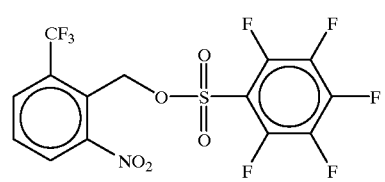 (VI-2)
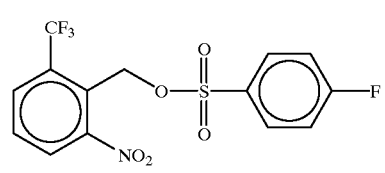 (VI-3)
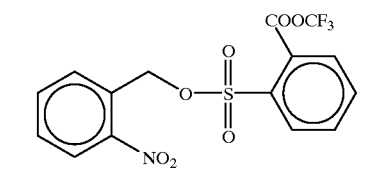 (VI-4)
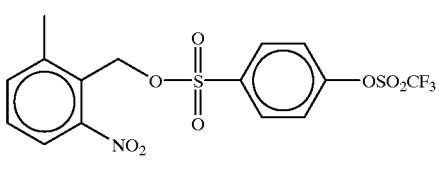 (VI-5)
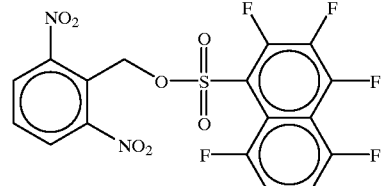 (VI-6)
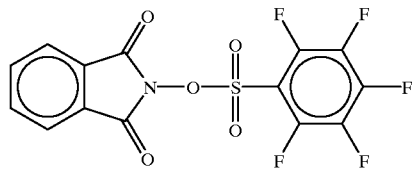 (VII-1)
-continued
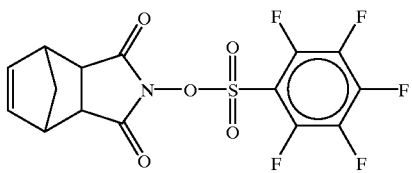 (VII-2)
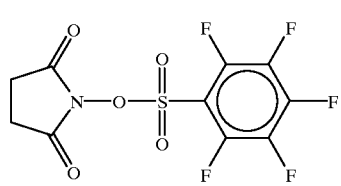 (VII-3)
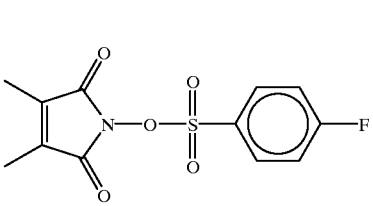 (VII-4)
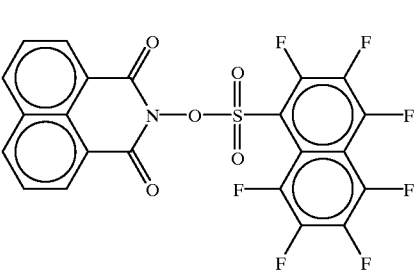 (VII-5)
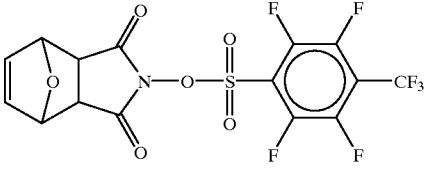 (VII-6)
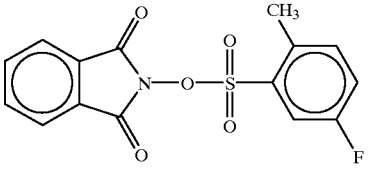 (VII-7)
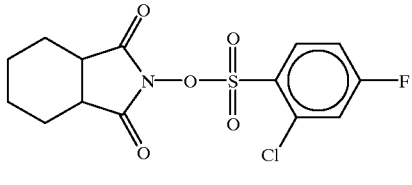 (VII-8)
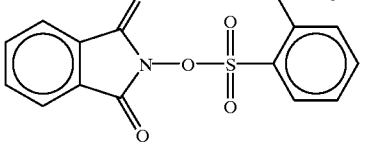 (VII-9)

Component (a) represented by general formulae (I) to (VII) may be used either alone or as a combination of two or more of them.

The content of component (a) is usually from 0.1% to 20% by weight, preferably from 0.5% to 10% by weight, and more preferably from 1% to 7% by weight, based on the solid content of the total positive-working electron beam or X-ray resist composition of the present invention.

The compounds of general formulae (I) and (II) can be synthesized, for example, by a method of reacting aryl Grignard reagents such as arylmagnesium bromides with substituted or unsubstituted phenyl sulfoxide, and salt exchanging the resulting triarylsulfonium halides with corresponding sulfonic acids, a method of condensing and salt exchanging substituted or unsubstituted phenyl sulfoxide and corresponding aromatic compounds using an acid catalyst such as methanesulfonic acid/diphosphorus pentaoxide or aluminum chloride, or a method of condensing and salt exchanging diaryl iodonium salts and diaryl sulfides using a catalyst such as copper acetate.

The compounds of formula (III) can be synthesized by reacting aromatic compounds with periodates.

Further, the sulfonic acids or sulfonates used in salt exchange can be obtained by a method of hydrolyzing commercial sulfonyl chlorides, reacting aromatic compounds with chlorosulfonic acids, or a method of reacting aromatic compounds with sulfamic acid.

Methods for synthesizing specific compounds of general formulae (I) to (III) are shown below in detail.

Synthesis of Tetramethylammonium Pentafluorobenzenesulfonate

In 100 ml of methanol, 25 g of pentafluorobenzenesulfonyl chloride was dissolved under ice cooling, and 100 g of a 25% aqueous solution of tetramethylammonium hydroxide was slowly added thereto. Stirring at room temperature for 3 hours provided a solution of tetramethylammonium pentafluorobenzenesulfonate. This solution was used for salt exchange with a sulfonium salt and an iodonium salt.

Synthesis of Triphenylsulfonium Pentafluorobenzenesulfonate: Synthesis of Specific Example (I-1)

In 800 ml of benzene, 50 g of diphenyl sulfoxide was dissolved, and 200 g of aluminum chloride was added thereto, followed by reflux for 24 hours. The reaction solution was slowly poured into 2 liters of water, and 400 ml of concentrated hydrochloric acid was added thereto, followed by heating at 70° C. for 10 minutes. This aqueous solution was washed with 500 ml of ethyl acetate, and filtered. Then, 200 g of ammonium iodide dissolved in 400 ml of water was added.

A precipitated powder was collected by filtration and washed with water, followed by washing with ethyl acetate and drying to obtain 70 g of triphenylsulfonium iodide.

In 1,000 ml of methanol, 30.5 g of triphenylsulfonium iodide was dissolved, and 19.1 g of silver oxide was added to this solution, followed by stirring at room temperature for 4 hours. The resulting solution was filtered, and the solution of tetramethylammonium pentafluorobnzenesulfonate synthesized above was added thereto in excess. The reaction solution was concentrated, and dissolved in 500 ml of dichloromethane. The resulting solution was washed with a 5% aqueous solution of tetramethylammonium hydroxide and water. An organic phase was dried with anhydrous sodium sulfate, and then dried to obtain triphenylsulfonium pentafluorobenzenesulfonate.

Synthesis of Triarylsulfonium Pentafluorobenzenesulfonates: Synthesis of Mixture of Specific Examples (I-9) And (II-1)

In 500 ml of water, 50 g of a triarylsulfonium chloride (a 50% aqueous solution of triphenylsulfonium chloride, manufactured by Fluka Co.) was dissolved, and the solution of tetramethylammonium pentafluorobnzenesulfonate was added thereto in excess. Thereupon, an oily product precipitated. A supernatant was removed by decantation, and the resulting oily product was washed with water and dried to obtain triarylsulfonium pentafluorobenzenesulfonates (containing specific examples (I-9) and (11-1) as main components).

Synthesis of Di(4-t-amylphenyl)iodonium Pentafluorobenzenesulfonate: Synthesis of Specific Example (III-1)

Sixty grams of t-amylbenzene, 39.5 g of potassium iodate, 81 g of acetic anhydride and 170 ml of dichloromethane were mixed, and 66.8 g of concentrated sulfuric acid was slowly added thereto under ice cooling. After stirring under ice cooling for 2 hours, the mixture was stirred at room temperature for 10 hours. To the reaction solution, 500 ml of water was added under ice cooling, and the resulting solution was extracted with dichloromethane. An organic phase was washed with sodium hydrogencarbonate and water, followed by concentration to obtain (4-t-amylphenyl) iodonium sulfate. This sulfate was added to an excess amount of the solution of tetramethylammonium pentafluorobnzenesulfonate. To this solution, 500 ml of water was added, and the resulting solution was extracted with dichloromethane. An organic phase was washed with a 5% aqueous solution of tetramethylammonium hydroxide and water, followed by concentration to obtain di(4-t-amylphenyl) iodonium pentafluorobenzenesulfonate.

Other compounds can be synthesized by methods similar to those described above.

[II] Photo-acid Generators Usable in Combination Other Than Component (a)

In the present invention, other than component (a), compounds which are decomposable by irradiation of electron beams or X-ray to generate an acid may be used in combination.

The amount of the photo-acid generator usable in combination with component (a) of the present invention is usually from 100/0 to 20/80, preferably from 100/0 to 40/60, and more preferably from 100/0 to 50/50, in a molar ratio (component (a)/other photo-acid generators).

Examples of the photo-acid generator which can be used in combination with the component (a) include photocationic polymerization initiator, photoradical polymerization initiator, dye photodecolorizer, photodiscolorizer, compounds which generate an acid when irradiated with electron beam or X-ray to be incorporated in miroresists etc., and mixture thereof. These photo-acid generators may be properly selected.

Examples of these photo-acid generators include onium salts such as diazonium salts, ammonium salts, phosphonium salts, iodonium salts, sulfonium salts, selenonium salts and arsonium salts, organic halogen compounds, organic metal compounds and organic halides, photo-acid generators containing o-nitrobenzyl type protective group, compounds which undergo photodecomposition to generate sulfonic acid such as iminosulfonate, and disulfone compounds.

Alternatively, compounds having a group or compound capable of generating an acid with irradiation of electron beam or X-ray incorporated in main chain or side chains of polymer may be used such as those described in U.S. Pat. No. 3,849,137, German Patent 3914407, JP-A-63-26653, JP-A-55-164824, JP-A-62-69263, JP-A-63-146038, JP-A-63-163452, JP-A-62-153853, and JP-A-63-146029.

Further, photo-acid generators described in U.S. Pat. No. 3,779,778, and European Patent 126,712 may be used.

Among the foregoing other compounds which undergo decomposition to generate an acid when irradiated with electron beam or X-ray, those which can be particularly effectively used will be described hereinafter.

(1) Oxazole derivatives represented by the following general formula (PAG1) or S-triazine derivatives represented by the following general formula (PAG2) substituted by trihalomethyl group (PAG1)
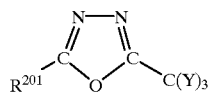

(PAG2)
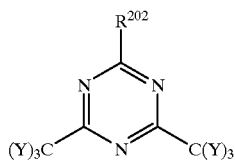

wherein $R^{201}$ represents a substituted or unsubstituted aryl or alkenyl group; $R^{202}$ represents a substituted or unsubstituted aryl, alkenyl or alkyl group or $-C(Y)_3$; and Y represents a chlorine or bromine atom.

Specific examples of these compounds will be given below, but the present invention should not be construed as being limited thereto.

(PAG1-1)
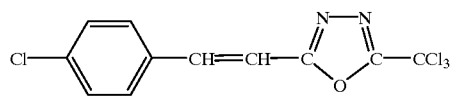

(PAG1-2)
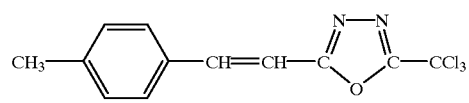

(PAG1-3)
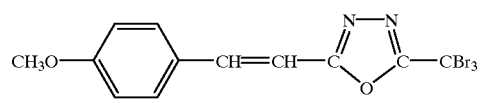

(PAG1-4)
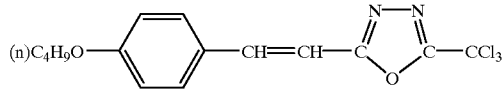

-continued (PAG1-5)
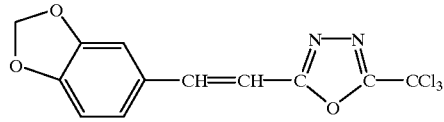

(PAG1-6)
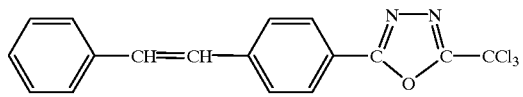

(PAG1-7)
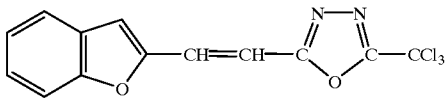

(PAG1-8)
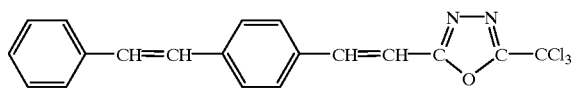

(PAG2-1)
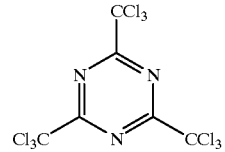

(PAG2-2)
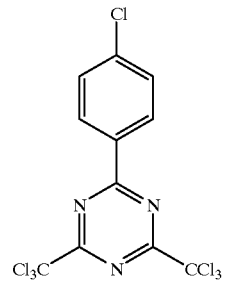

(PAG2-3)
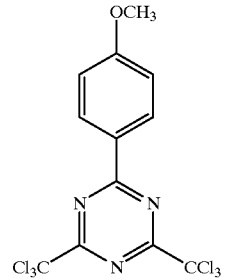

(PAG2-4)
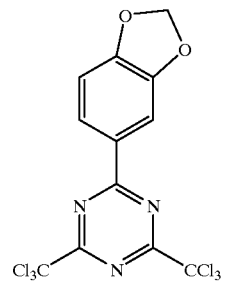

-continued (PAG2-5)
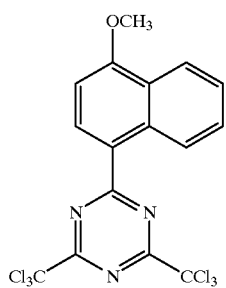

(PAG2-6)
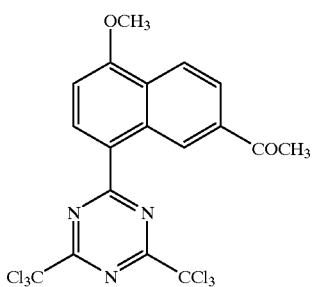

(PAG2-7)
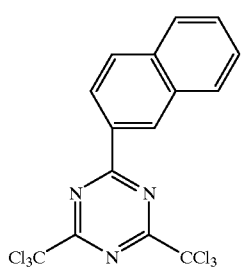

(PAG2-8)
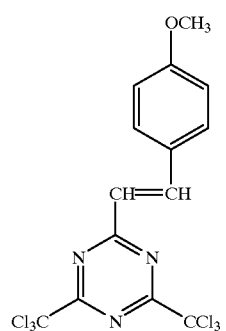

(PAG2-9)
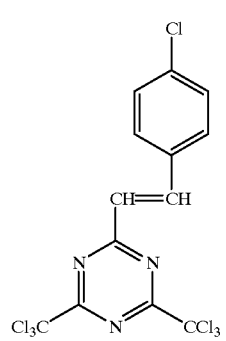

-continued (PAG2-10)
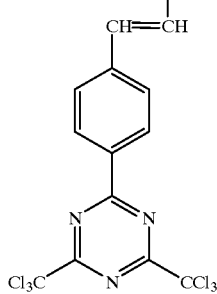

(2) Iodonium salts represented by the following general formula (PAG3) or sulfonium salts represented by the general formula (PAG4)

(PAG3)

(PAG4)
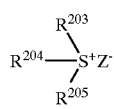

In the foregoing general formulae, $Ar^1$ and $Ar^2$ each independently represent a substituted or unsubstituted aryl group. Preferred examples of substituents on the aryl group include alkyl group, haloalkyl group, cycloalkyl group, aryl group, alkoxy group, nitro group, carboxyl group, alkoxycarbonyl group, hydroxyl group, mercapto group, and halogen atom.

$R^{203}$, $R^{204}$ and $R^{205}$ each independently represent a substituted or unsubstituted alkyl or aryl group, preferably a $C_{6-14}$ aryl group, $C_{1-8}$ alkyl group or substituted derivative thereof. Preferred examples of substituents on these alkyl groups include $C_{1-8}$ alkoxy group, $C_{1-8}$ alkyl group, nitro group, carboxyl group, hydroxyl group, and halogen atom. Preferred examples of substituents on these alkyl groups include $C_{1-8}$ alkoxy, carboxyl and alkoxycarbonyl groups.

$Z^-$ represents a counter ion. Examples of the counter ion include $BF_4^-$, $AsF_6^-$, $PF_6^-$, $SbF_6^-$, $SiF_2^{2-}$, $ClO_4^-$, perfluoroalkanesulfonic acid anion such as $CF_3SO_3^-$, pentafluorobenzene sulfonic acid anion, condensed polynuclear aromatic sulfonic acid anion such as naphthalene-1-sulfonic acid anion, anthraquinonesulfonic acid anion, and sulfonic acid group-containing dye.

Two of $R^{203}$, $R^{204}$ and $R^{205}$ and $Ar^1$ and $Ar^2$ may be connected to each other via their single bond or substituent.

Specific examples of the compounds represented by the foregoing general formulae (PAG3) and (PAG4) will be given below, but the present invention should not be construed as being limited thereto.

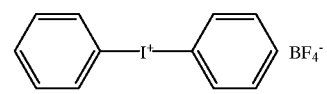 (PAG3-1)
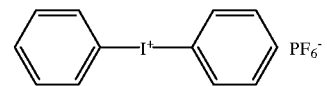 (PAG3-2)
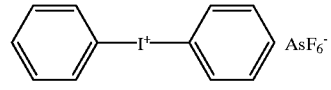 (PAG3-3)
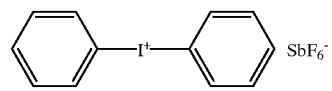 (PAG3-4)
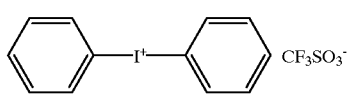 (PAG3-5)
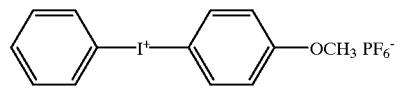 (PAG3-6)
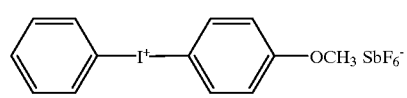 (PAG3-7)
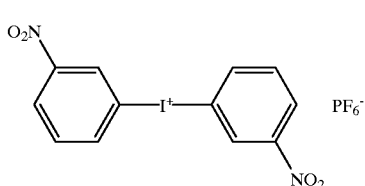 (PAG3-8)
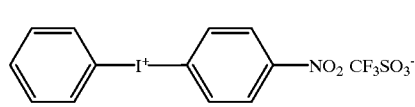 (PAG3-9)
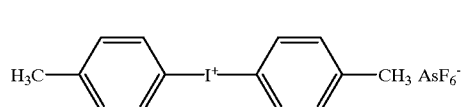 (PAG3-10)
 (PAG3-11)
-continued
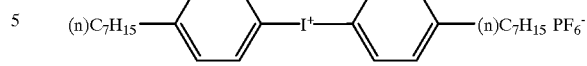 (PAG3-12)
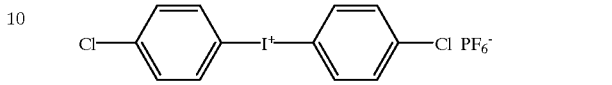 (PAG3-13)
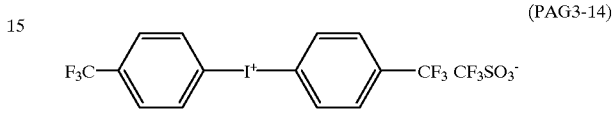 (PAG3-14)
 (PAG3-15)
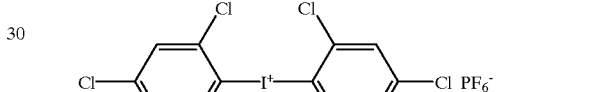 (PAG3-16)
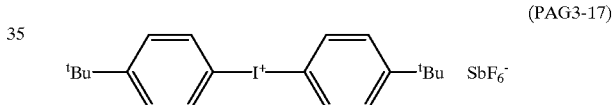 (PAG3-17)
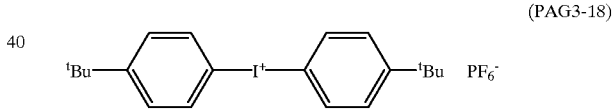 (PAG3-18)
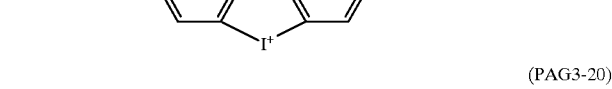 (PAG3-19)
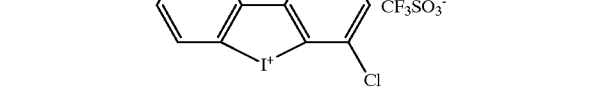 (PAG3-20)
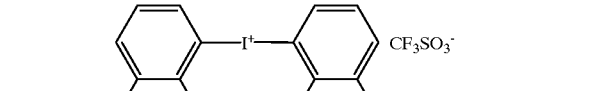 (PAG3-21)

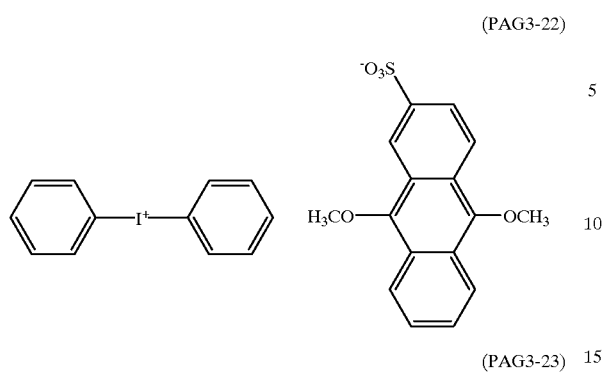
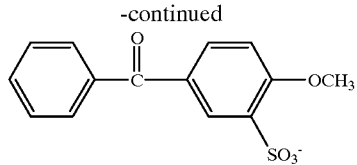
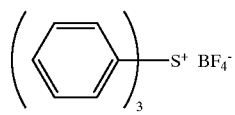
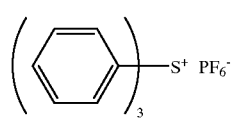
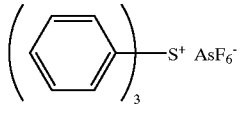
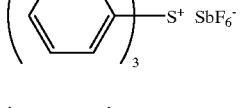
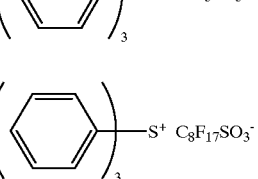
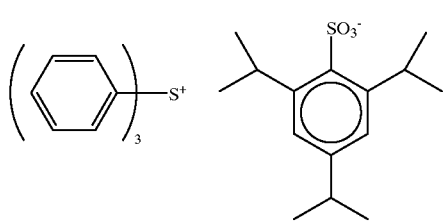
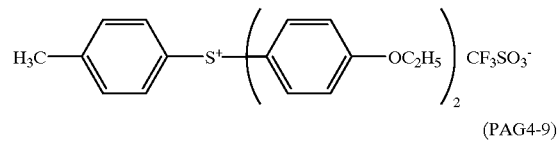
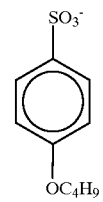

-continued
(PAG4-10)
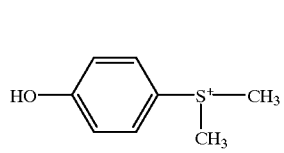 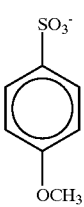
(PAG4-11)
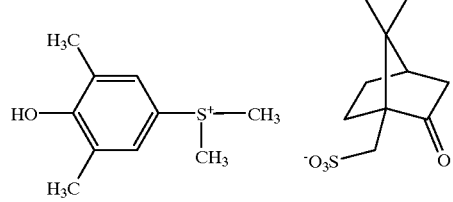 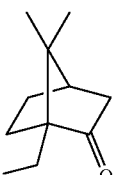
(PAG4-12)
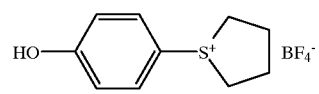
(PAG4-13)
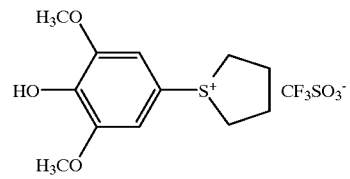
(PAG4-14)
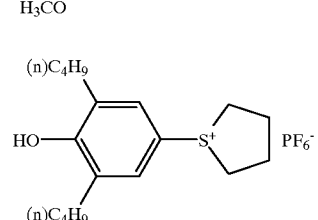
(PAG4-15)
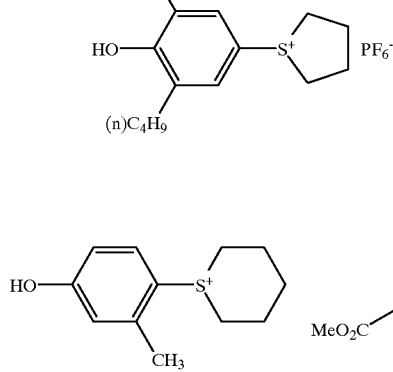
(PAG4-16)
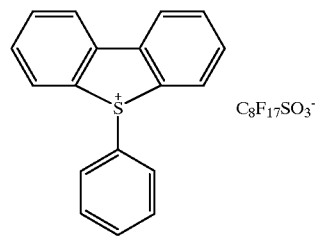
(PAG4-17)
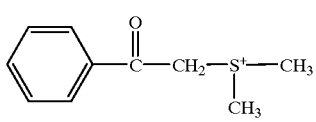
-continued
(PAG4-18)
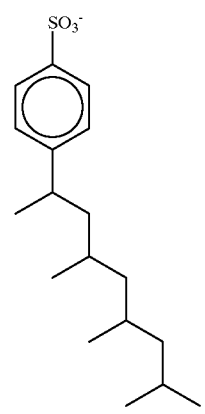
(PAG4-19)
(PAG4-20)
(PAG4-21)
(PAG4-22)
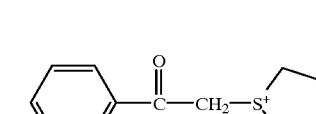
(PAG4-23)

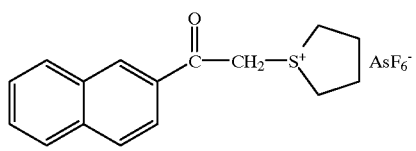
(PAG4-24)

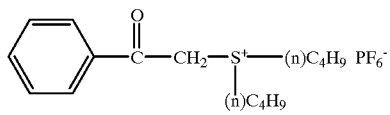
(PAG4-25)

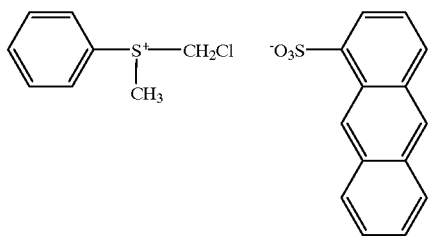
(PAG4-32)

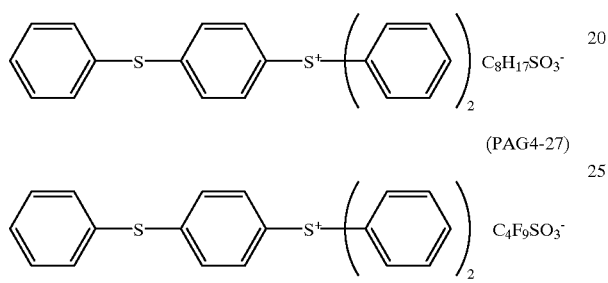
(PAG4-26), (PAG4-27), (PAG4-28), (PAG4-29)

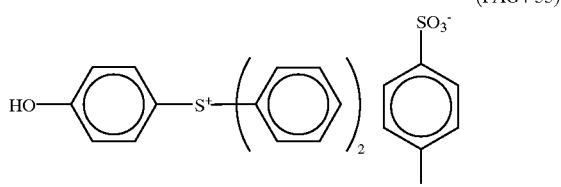
(PAG4-33)

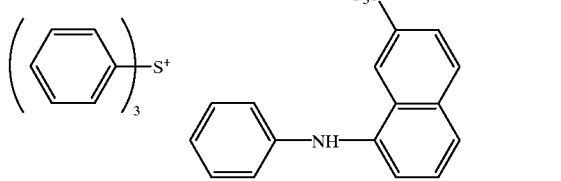
(PAG4-34)

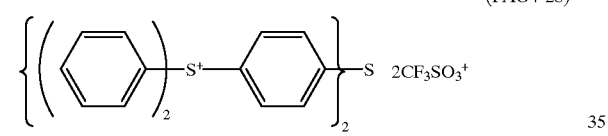
(PAG4-30)

The onium salts represented by the general formulae (PAG3) and (PAG4) are known. The synthesis of these onium salts can be accomplished by the method described in U.S. Pat. Nos. 2,807,648 and 4,247,473, and JP-A-53-101,331.

(3) Disulfone derivatives represented by the following general formula (PAG5) or iminosulfonate derivatives represented by the following general formula (PAG6)

$$Ar^3-SO_2-SO_2-Ar^4 \quad \text{(PAG5)}$$

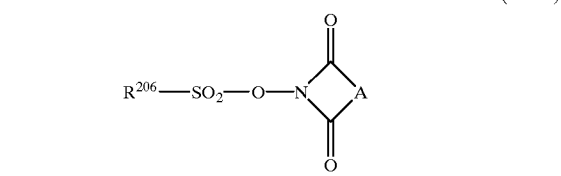
(PAG6)

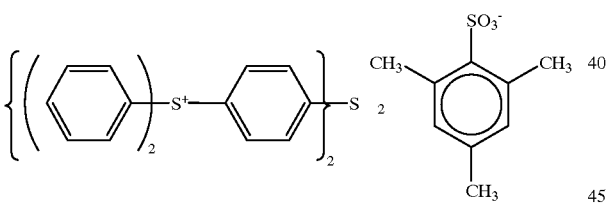
(PAG4-31)

wherein $Ar^3$ and $Ar^4$ each independently represent a substituted or unsubstituted aryl group; $R^{206}$ represents a substituted or unsubstituted alkyl or aryl group; and A represents a substituted or unsubstituted alkylene, alkenylene or arylene group.

Specific examples of these compounds represented by the general formulae (PAG5) and (PAG6) will be given below, but the present invention should not be construed as being limited thereto.

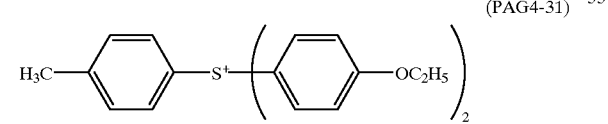

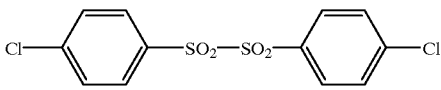
(PAG5-1)

(PAG5-2)
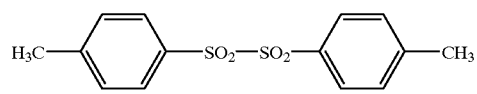
(PAG5-3)
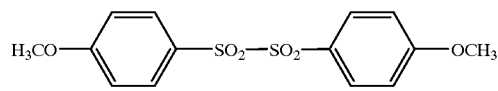
(PAG5-4)
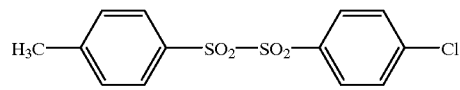
(PAG5-5)
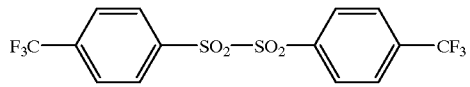
(PAG5-6)
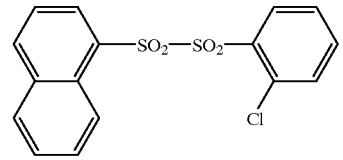
(PAG5-7)
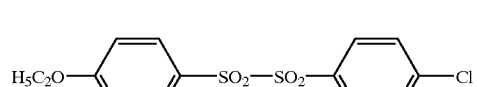
(PAG5-8)
(PAG5-9)
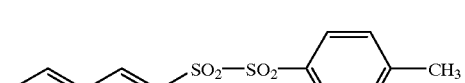
(PAG5-10)
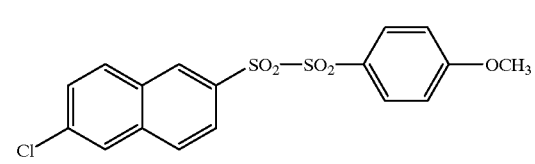
(PAG5-11)
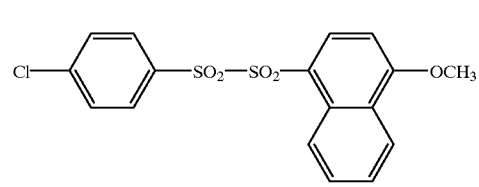
(PAG5-12)
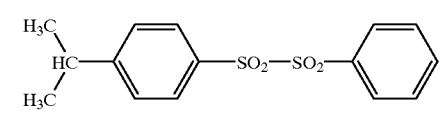
(PAG5-13)
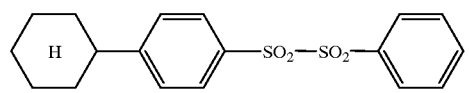
(PAG6-1)
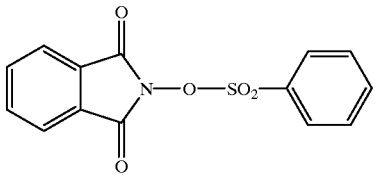
(PAG6-2)
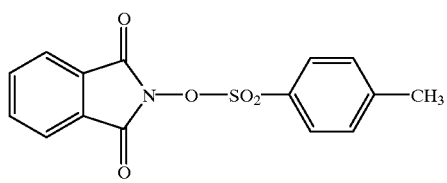
(PAG6-3)
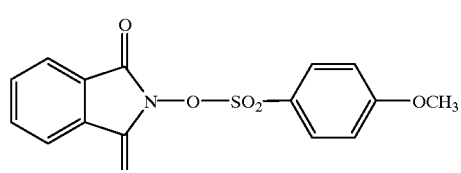
(PAG6-4)
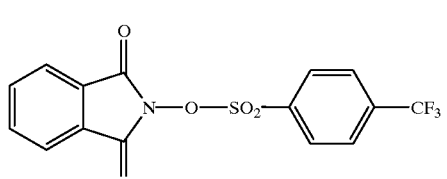
(PAG6-5)
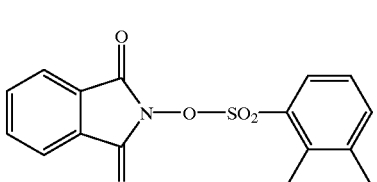
(PAG6-6)
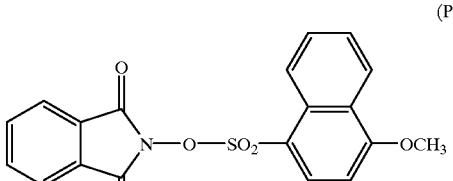
(PAG6-7)
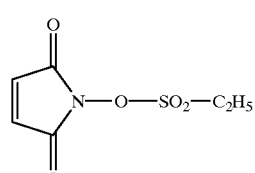

(PAG6-8)
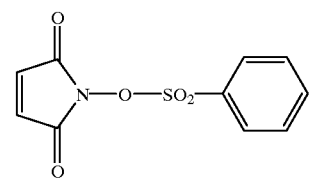

(PAG6-9)
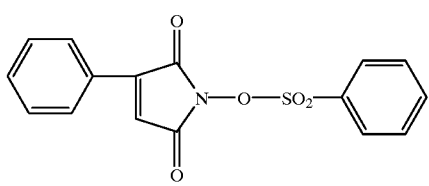

(PAG6-10)
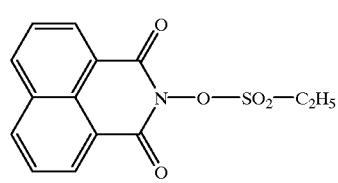

(PAG6-11)
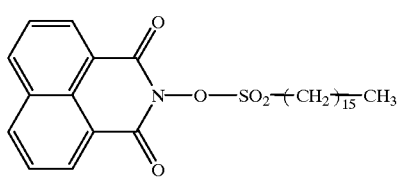

(PAG6-12)
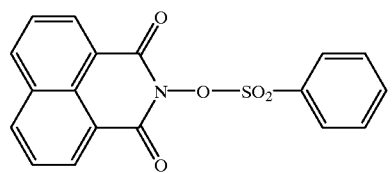

(PAG6-13)
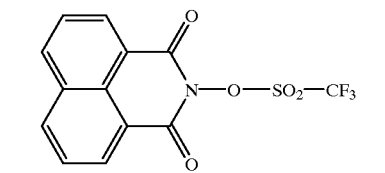

[III] Resin Containing a Group which Undergoes Decomposition to Increase its Solubility in an Alkaline Developer when Acted on by an Acid (Hereinafter Referred to as "Component (b)")

As the resin which can be used in the positive-working electron beam or X-raty resist composition of the present invention which undergoes decomposition to increase its solubility in an alkaline developer when acted on by an acid (also referred to as "acid-decomposable group") there may be used a resin containing an acid-decomposable group in either or both of main chain and side chains, preferably side chains.

Preferred examples of the acid-decomposable group include —COOA$^0$ and —O—B$^0$ groups. Examples of the group containing such an acid-decomposable group include groups represented by —R$^0$—COOA$^0$ and —Ar—O—B$^0$.

A$^0$ represents —C(R$^{01}$)(R$^{02}$)(R$^{03}$) —Si(R$^{01}$)(R$^{02}$)(R$^{03}$) or —C(R$^{04}$)(R$^{05}$)—O—R$^{06}$ group. B$^0$ represents A$^0$ or —CO—O—A$^0$ group (in which R$^0$, R$^{01}$ to R$^{06}$, and Ar are as defined above)

Preferred examples of the acid-decomposable group include silylether group, cumylester group, acetal group, tetrahydropyranylether group, enol ether group, enol ester group, tertiary alkyl ether group, tertiary alkyl ester group, and tertiary alkylcarbonate group. Preferred among these acid-decomposable groups are tertiary alkyl ester group, tertiary alkylcarbonate group, cumylester group, acetal group, and tetrahydropyranylether group.

The parent resin to which the foregoing acid-decomposable group is bonded as a side chain is an alkali-soluble resin having —OH or —COOH group, preferably —R$^0$—COOH or —Ar—OH group, in its side chains. For example, alkali-soluble resins described later may be used.

The rate at which such an alkali-soluble resin is dissolved in an alkali is preferably not less than 170 A/sec., particularly not less than 330 A/sec. as determined with 0.261 N tetramethyl ammonium hydroxide (TMAH) at 23° C.

From this standpoint of view, particularly preferred examples of the alkali-soluble resin include o-, m-, p-poly(hydroxystyrene), copolymers thereof, hydrogenated poly(hydroxystyrene), halogen- or alkyl-substituted poly(hydroxystyrene), partially O-alkylated or O-acylated poly(hydroxystyrene); styrene-hydroxystyrene copolymer, α-methylstyrene-hydroxystyrene copolymer, and hydrogenated novolak resin.

The component (b) can be obtained by reacting an alkali-soluble resin with a precursor of acid-decomposable group or copolymerizing an alkali-soluble resin monomer to which an acid-decomposable group is connected with various monomers as disclosed in European Patent 254853, JP-A-2-25850, JP-A-3-223860, and JP-A-4-251259.

Specific examples of component (b) will be given below, but should not be construed as being limited thereto.

(b-1)
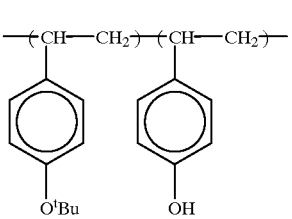

(b-2)
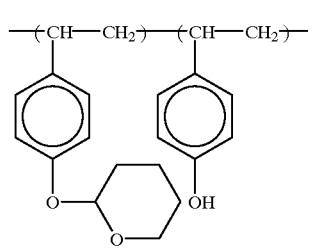

(b-3)
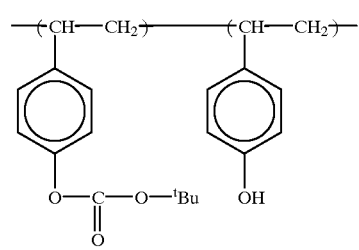

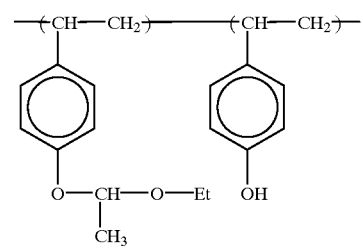
(b-4)
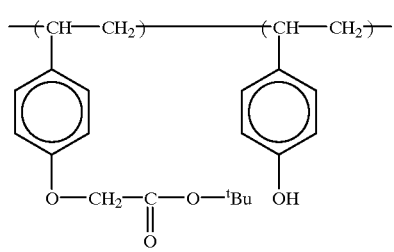
(b-5)
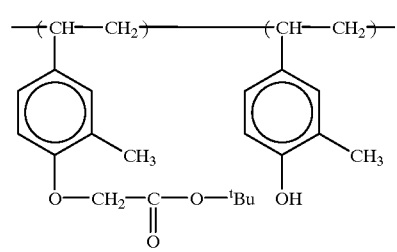
(b-6)
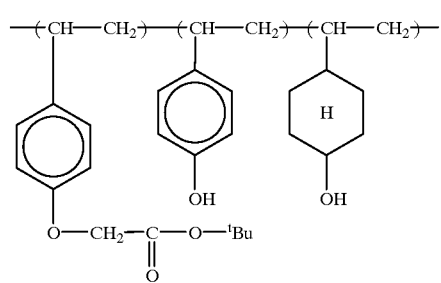
(b-7)
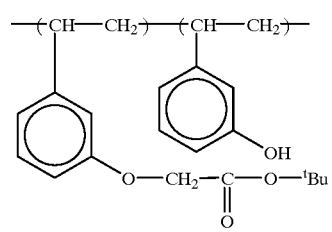
(b-8)
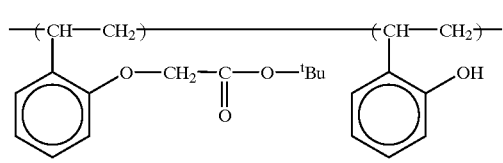
(b-9)
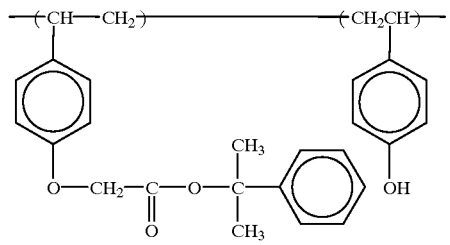
(b-10)
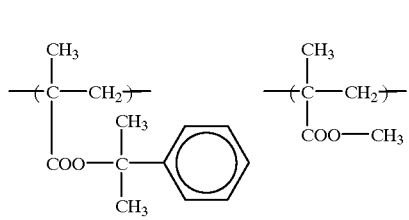
(b-11)
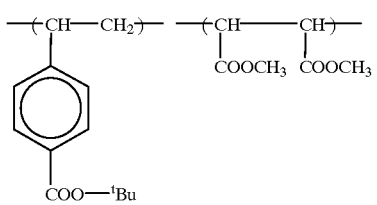
(b-12)
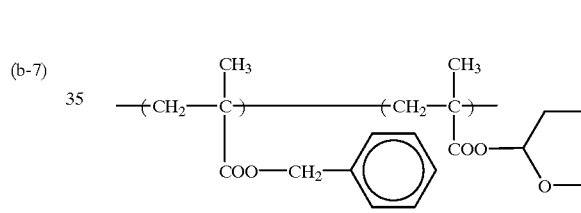
(b-13)
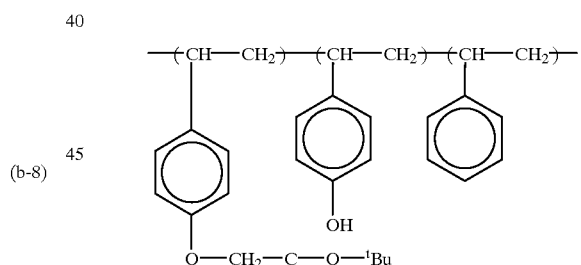
(b-14)
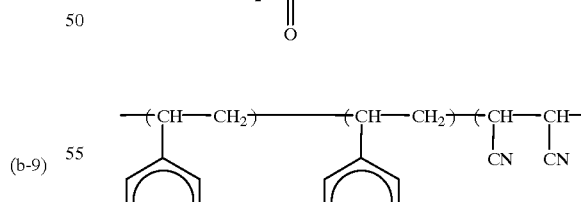
(b-15)
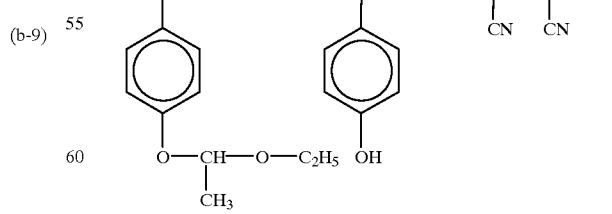

-continued
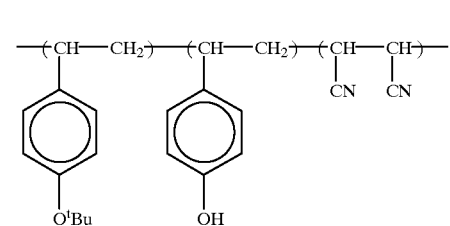
(b-16)
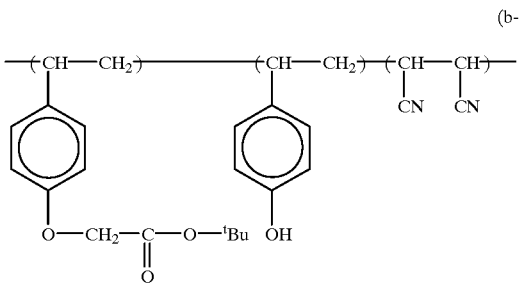
(b-17)
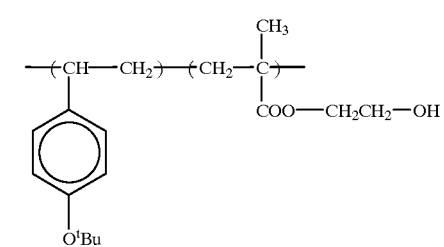
(b-18)
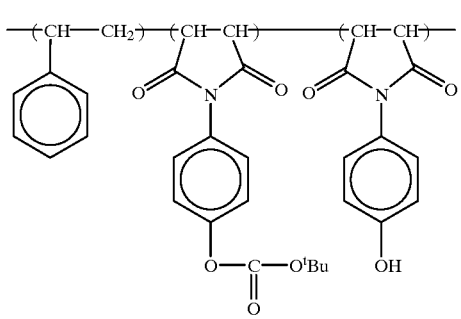
(b-19)
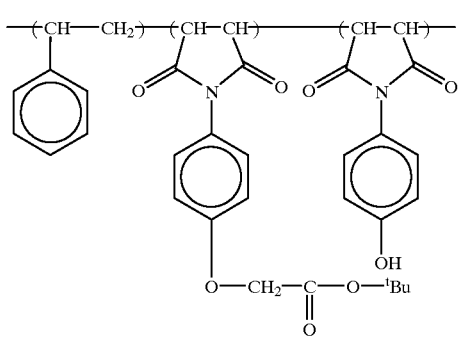
(b-20)
-continued
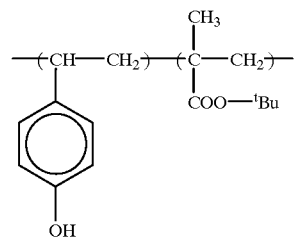
(b-21)
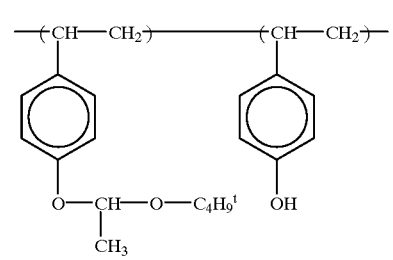
(b-22)
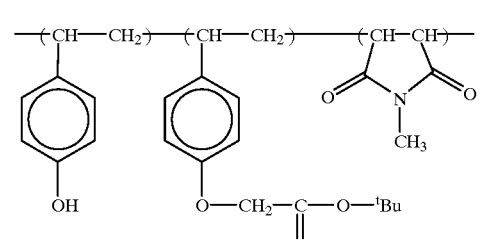
(b-23)
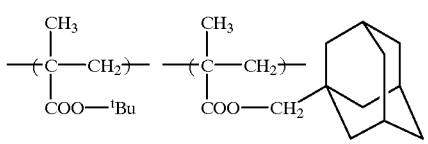
(b-24)
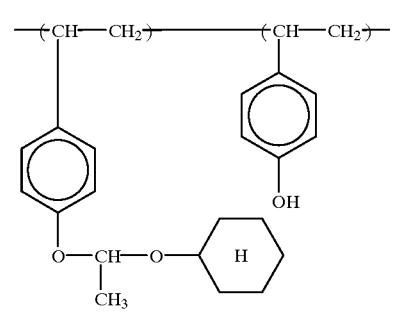
(b-25)
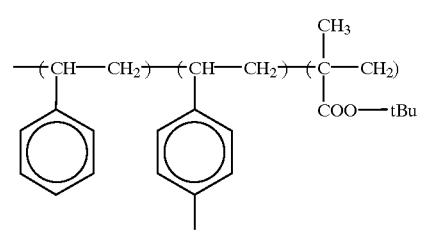
(b-26)

(b-27)
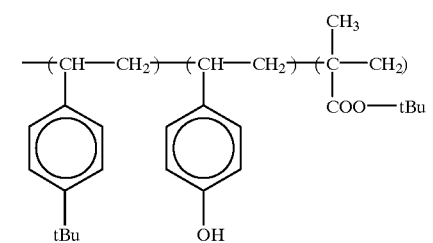
(b-28)
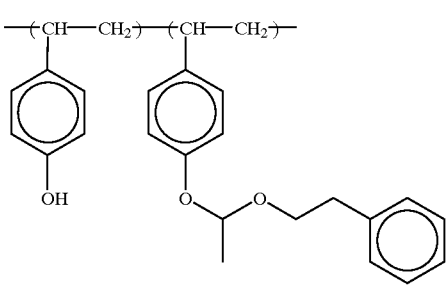
(b-29)
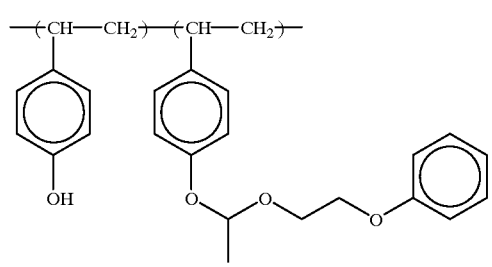
(b-30)
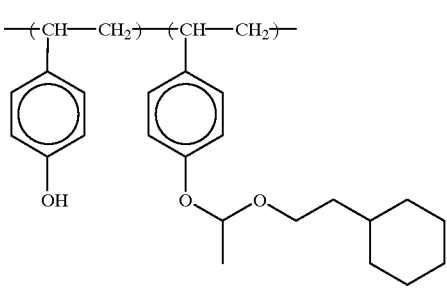
(b-31)
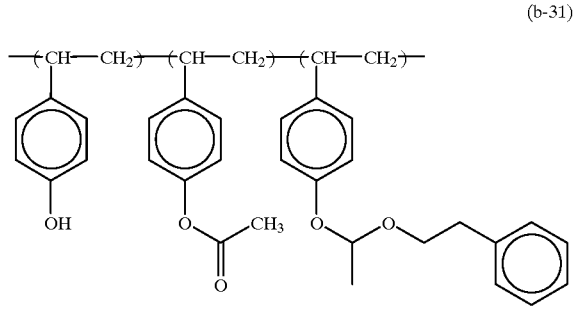
(b-32)
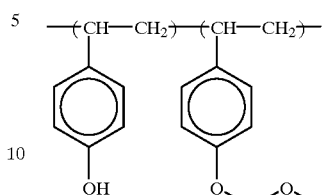
(b-33)
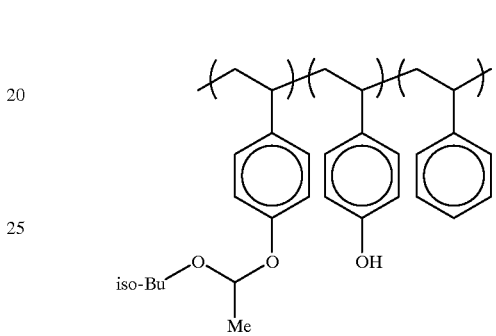
(b-34)
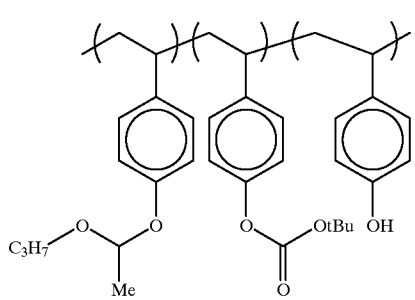
(b-35)
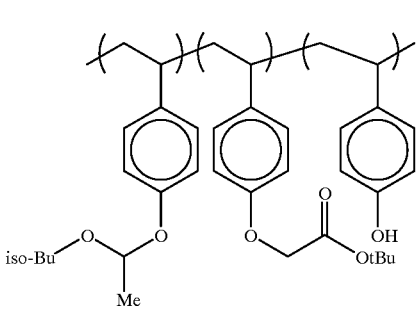

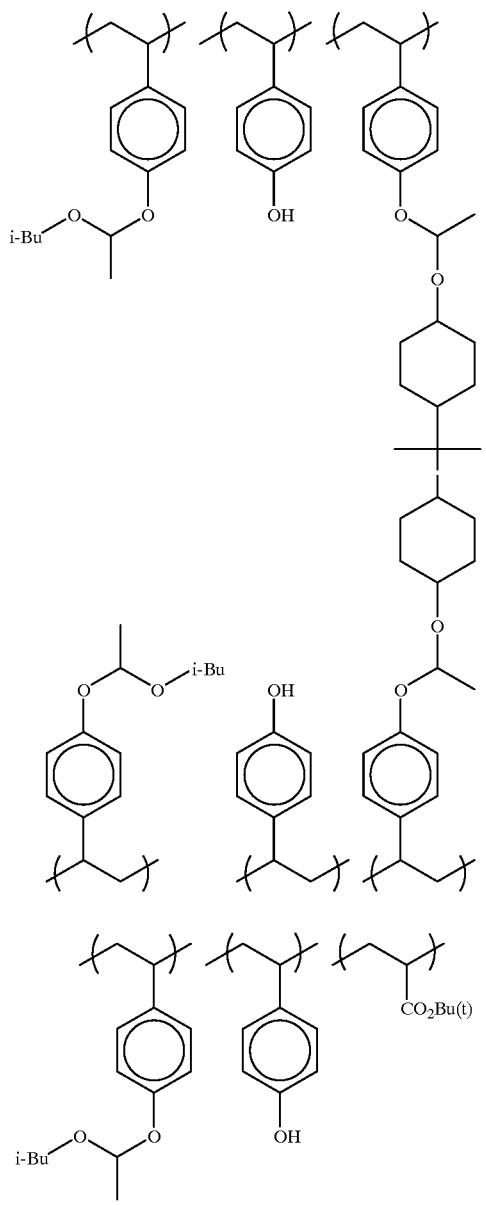

(b-36)

(b-37)

The content of the acid-decomposable group is represented by B/(B+S) wherein B represents the number of acid-decomposable groups in the resin and S represents the number of alkali-soluble groups which are not protected by the acid-decomposable group. B/(B+S) is preferably from 0.01 to 0.7, more preferably from 0.05 to 0.50, particularly from 0.05 to 0.40. If B/(B+S) exceeds 0.7, it disadvantageously causes film shrinkage after PEB, poor adhesion to substrate or generation of scum. On the contrary, if B/(B+S) falls below 0.01, it may disadvantageously cause standing wave to remain remarkably on the side wall of pattern.

The weight-average molecular weight (Mw) of component (b) is preferably from 2,000 to 200,000. If the weight-average molecular weight (Mw) of the resin containing an acid-decomposable group falls below 2,000, the thickness of the photosensitive composition is reduced when the unexposed area is developed. On the contrary, if the weight-average molecular weight (Mw) of the resin containing an acid-decomposable group exceeds 200,000, the rate at which the resin itself is dissolved in an alkali is reduced, lowering the sensitivity. The weight-average molecular weight (Mw) of component (b) is more preferably from 5,000 to 100,000, most preferably from 8,000 to 50,000. The degree of distribution of molecular weight (Mw/Mn) is preferably from 1.0 to 4.0, more preferably from 1.0 to 2.0, most preferably from 1.0 to 1.6. The smaller the degree of the distribution degree is, the better the heat resistance and image-forming property (pattern profile, defocus latitude, etc.) are. The weight-average molecular weight (Mw) of the resin containing an acid-decomposable group is determined by gel permeation chromatography as calculated in terms of polystyrene.

Two or more components (b) of the photosensitive composition of the present invention may be used in admixture. The amount of the component (b) is generally from 40 to 99% by weight, preferably from 60 to 95% by weight based on the total weight of the solid components of the photosensitive composition. Furthermore, an alkali-soluble resin not containing any acid-decomposable group may be mixed in order to adjust the alkali-solubility.

In the present invention, the dissolution inhibitive compound (d) described below may be incorporated into the photosensitive composition of the present invention. In this case, the amount of the dissolution inhibitive compound (d) is generally from 3 to 45% by weight, preferably from 5 to 30% by weight, more preferably from 10 to 20% by weight based on the total amount of the solid components of the photosensitive composition.

[IV] Fluorine and/or Silicon Surfactant (Component (c))

The fluorine type and/or silicon type surfactant (c) contained in each positive-working electron beam or X-ray resin composition of the present invention will be explained next.

Each photosensitive resin composition of the present invention can contain either a fluorine type surfactant or a silicon type surfactant, or both of them.

Examples of such surfactants (c) include the surfactants described in U.S. Pat. Nos 5,405,720, 5,360,692, 5,529,881, 5,296,330, 5,436,098, 5,576,143, 5,294,511, and 5,824,451, JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988. It is also possible to use the following commercial surfactants as they are.

Examples of usable commercial surfactants include fluorine type and/or silicon type surfactants such as F-Top EF301 and EF303 (manufactured by New Akita Chemical Company), Florad FC430 and FC431 (manufactured by Sumitomo 3M Ltd.), Megafac F171, F173, F176, F189, and R08 (manufactured by Dainippon Ink & Chemicals, Inc.), and Surflon S-382, SC-101, SC-102, SC-103, SC-104, SC-105, and SC-106 (manufactured by Asahi Glass Co., Ltd.). Polysiloxane polymer KP-341 (manufactured by Shin-Etsu Chemical Co., Ltd.) and Troysol S-366 (Troy Chemical Co.) are also usable as a silicon type surfactant.

The incorporation amount of the surfactant (c) is generally from 0.00001 to 2 parts by weight, preferably from 0.0001 to 1 part by weight, per 100 parts by weight of the composition of the invention on a solid basis. Those surfactants can be used alone or in combination of two or more thereof.

[V] Low Molecular Dissolution Inhibitive Compound (Component (d))

The photosensitive composition of the present invention may comprise a low molecular acid-decomposable dissolution inhibitive compound (d) (hereinafter occasionally referred to as "component (d)") incorporated therein. The component (d) is a low molecular compound with a molecular weight of not more than 3,000 containing an acid-decomposable group which increases its solubility in an alkaline developer when acted on by an acid.

The component (d), i.e., acid-decomposable dissolution inhibitive compound is preferably a compound containing at least two acid-decomposable groups in its structure wherein at least 8 connecting atoms other than acid-decomposable group are interposed between the acid-decomposable groups which are separated from each other at the greatest distance.

Preferred examples of the foregoing acid-decomposable dissolution inhibitive compound include (a) a compound containing at least two acid-decomposable groups in its structure wherein at least 10, preferably at least 11, more preferably at least 12 connecting atoms other than acid-decomposable group are interposed between the acid-decomposable groups which are separated from each other at the greatest distance, and (b) a compound containing at least three acid-decomposable groups in its structure wherein at least 9, preferably at least 10, more preferably at least 11 connecting atoms other than acid-decomposable group are interposed between the acid-decomposable groups which are separated from each other at the greatest distance.

The upper limit of the number of the foregoing connecting atoms is preferably 50, more preferably 30.

If the acid-decomposable dissolution inhibitive compound contains three or more, preferably four or more acid-decomposable groups, even two acid-decomposable groups, its capacity of inhibiting dissolution in an alkali-soluble resin is remarkably enhanced as far as these acid-decomposable groups are separated from each other at a predetermined or greater distance.

The distance between the acid-decomposable groups is represented by the number of connecting atoms interposed therebetween excluding the acid-decomposable groups. In the case of the following compounds (1) and (2) for example, the distance between the acid-decomposable groups is four connecting atoms. In the case of the following compound (3), the distance between the acid-decomposable groups is 12 connecting atoms.

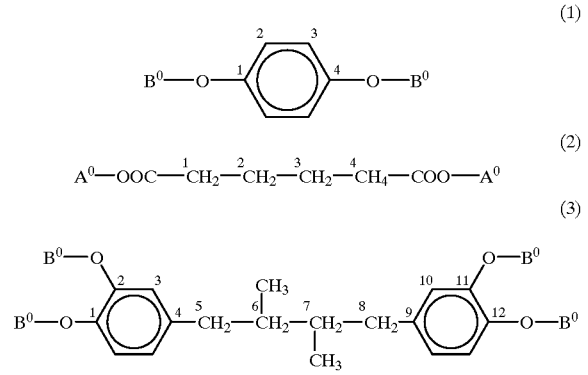

Acid-decomposable group: —COO—A$^0$, —O—B$^0$

Further, the acid-decomposable dissolution inhibitive compound may have a plurality of acid-decomposable groups on one benzene ring. Preferably, it is a compound formed by a skeleton having one acid-decomposable group on one benzene ring. The molecular weight of component (d) is generally 3,000 or less, preferably from 300 to 3,000, more preferably from 500 to 2,500.

An example of the acid-decomposable group, i.e., group containing —COO—A$^0$ group or —O—B$^0$ group is preferably a group represented by the general formula —R$^0$—COO—A$^0$ or —Ar—O—B$^0$.

A$^0$ represents —C(R$^{01}$)(R$^{02}$)(R$^{03}$), —Si(R$^{01}$)(R$^{02}$)(R$^{03}$) or —C(R$^{04}$)(R$^{05}$)—O—R$^{06}$ group. B$^0$ represents A$^0$ or —CO—O—A$^0$ group.

R$^{01}$, R$^{02}$, R$^{03}$, R$^{04}$ and R$^{05}$ may be the same or different and each represent a hydrogen atom, alkyl group, cycloalkyl group, alkenyl group or aryl group, and R$^{06}$ represents an alkyl or aryl group, with the proviso that at least two of R$^{01}$ to R$^{03}$ are groups other than hydrogen atom and two of R$^{01}$ to R$^{03}$ and R$^{04}$ to R$^{06}$ may be connected to each other to form a ring. R$^0$ represents a divalent or higher aliphatic or aromatic hydrocarbon group which may contain substituents. —Ar— represents a divalent or higher aromatic group which may contain monocyclic or polycyclic substituents.

The alkyl group represented by R$^{01}$, R$^{02}$, R$^{03}$, R$^{04}$ or R$^{05}$ is preferably a C$_{1-4}$ alkyl group such as methyl, ethyl, propyl, n-butyl, sec-butyl and t-butyl. The cycloalkyl group represented by R$^{01}$, R$^{02}$, R$^{03}$, R$^{04}$ or R$^{05}$ is preferably a C$_{3-10}$ cycloalkyl group such as cyclopropyl, cyclobutyl, cyclohexyl and adamantyl. The alkenyl group represented by R$^{01}$, R$^{02}$, R$^{03}$, R$^{04}$ or R$^{05}$ is preferably a C$_{2-4}$ alkenyl group such as vinyl, propenyl, allyl and butenyl. The aryl group represented by R$^{01}$, R$^{02}$, R$^{03}$, R$^{04}$ or R$^{05}$ is preferably a C$_{6-14}$ aryl group such as phenyl, xylyl, toluyl, cumenyl, naphthyl and anthracenyl.

Examples of substituents on these groups include a hydrogen atom, a halogen atom (fluorine, chlorine, bromine, iodine), nitro group, cyano group, the foregoing alkyl group, alkoxy group such as methoxy, ethoxy, hydroxyethoxy, propoxy, hydroxypropoxy, n-butoxy, isobutoxy, sec-butoxy and t-butoxy, alkoxycarbonyl group such as methoxycarbonyl and ethoxycarbonyl, aralkyl group such as benzyl, phenethyl and cumyl, aralkyloxy group, acyl group such as formyl, acetyl, butyryl, benzoyl, cyanamyl and valeryl, acyloxy group such as butyryloxy, the foregoing alkenyl group, alkenyloxy group such as vinyloxy, propenyloxy, allyloxy and butenyloxy, the foregoing aryl group, aryloxy group such as phenoxy, and aryloxycarbonyl group such as benzoyloxy.

Preferred examples of the acid-decomposable group include silylether group, cumylester group, acetal group, tetrahydropyranylether group, enolether group, enol ester group, tertiary alkyl ether group, tertiary alkyl ester group, and tertiary alkylcarbonate group. Preferred among these acid-decomposable groups are tertiary alkyl ester group, tertiary alkylcarbonate group, cumylester group, and tetrahydropyranylether group.

The component (d) includes a compound protected by connecting some or all of phenolic hydroxyl groups in polyhydroxy compounds described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application No. 3-33229, Japanese Patent Application No. 3-230790, Japanese Patent Application No. 3-320438, Japanese Patent Application No. 4-25157, Japanese Patent Application No. 4-52732, Japanese Patent Application No. 4-103215, Japanese Patent Application No. 4-104542, Japanese Patent Application No. 4-107885, Japanese Patent Application No. 4-107889, and Japanese Patent Application No.4-152195 via the foregoing group —R$^0$—COO—A$^0$ or B$^0$.

Preferred among these compounds are those comprising polyhydroxy compounds described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application No. 4-25157, Japanese Patent Application No. 4-103215, Japanese Patent Application No. 4-104542, Japanese Patent Application No. 4-107885, Japanese Patent Application No. 4-107889, and Japanese Patent Application No. 4-152195.

Specific examples of these compounds include those represented by the following general formulae [I] to [XVI]:

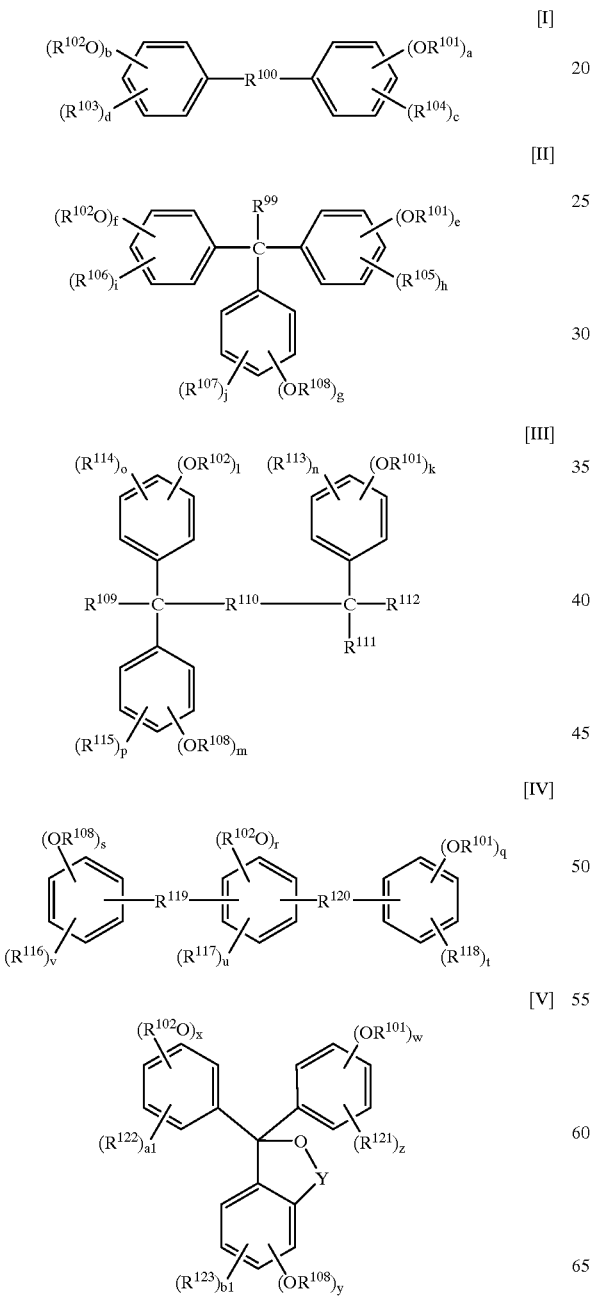
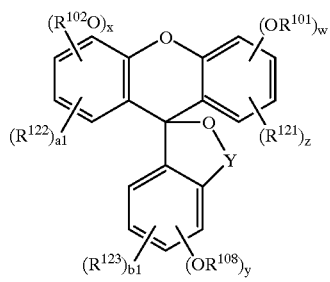
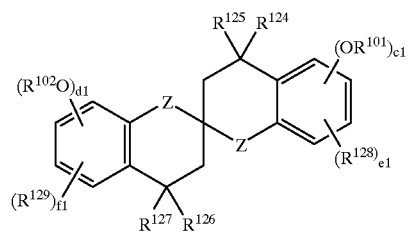
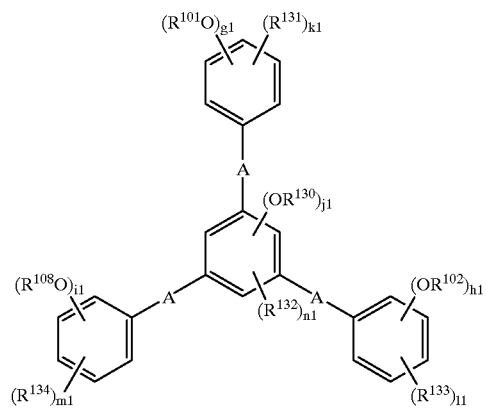
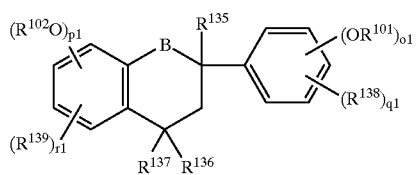
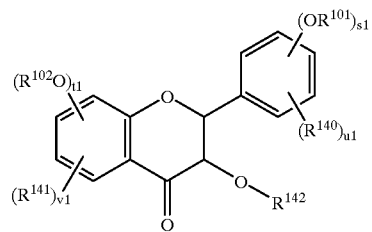
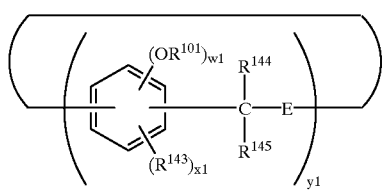

-continued

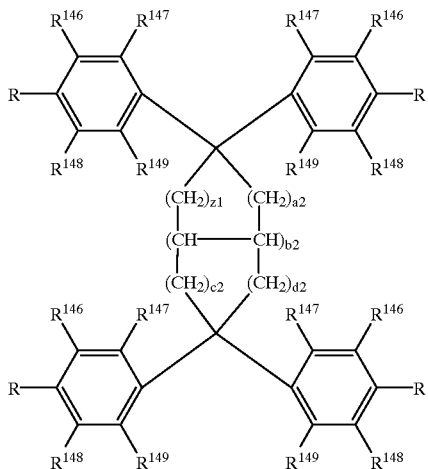
[XII]

wherein $R^{101}$, $R^{102}$, $R^{108}$ and $R^{130}$ may be the same or different and each represent a hydrogen atom, —$R^0$—COO—C($R^{01}$)($R^{02}$)($R^{03}$) or —CO—O—C ($R^{01}$)($R^{02}$)($R^{03}$) (in which $R_0$, $R^{01}$, $R^{02}$ and $R^{03}$ are as defined above); $R^{100}$ represents —CO—, —COO—, —NHCONH—, —NHCOO—, —O—, —S—, —SO—, —SO$_2$—, —SO$_3$— or

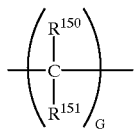

wherein G represents an integer of from 2 to 6, with the proviso that when G is 2, at least one of $R^{150}$ and $R^{151}$ is an alkyl group; $R^{150}$ and $R^{151}$ may be the same or different and each represent a hydrogen atom, alkyl group, alkoxy group, —OH, —COOH, —CN, halogen atom, —$R^{152}$—COOR$^{153}$ or —$R^{154}$—OH; RF$^{152}$ and $R^{154}$ each represent an alkylene group; $R^{153}$ represents a hydrogen atom, alkyl group, aryl group or aralkyl group; $R^{99}$, $R^{103}$ to $R^{107}$ $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$ and $R^{143}$ may be the same or different and each represent a hydrogen atom, hydroxyl group, alkyl group, alkoxy group, acyl group, acyloxy group, aryl group, aryloxy group, aralkyl group, aralkyloxy group, halogen atom, nitro group, carboxyl group, cyano group or —N($R^{155}$) ($R^{156}$) (in which $R^{155}$ and $R^{156}$ each represent a hydrogen atom, alkyl group or aryl group); $R^{110}$ represents a single bond, alkylene group or

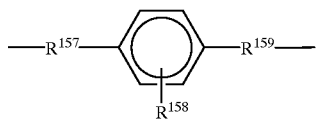

wherein $R^{157}$ and $R^{159}$ may be the same or different and each represent a single bond, alkylene group, —O—, —S—, —CO— or carboxyl group; and $R^{158}$ represents a hydrogen atom, alkyl group, alkoxy group, acyl group, acyloxy group, aryl group, nitro group, hydroxyl group, cyano group or carboxyl group, with the proviso that the hydroxyl group may be replaced by an acid-decomposable group (e.g., t-butoxycarbonylmethyl, tetrahydropyranyl, 1-ethoxy-1-ethyl, 1-t-butoxy-1-ethyl); $R^{119}$ and $R^{120}$ may be the same or different and each represent a methylene group, lower alkyl-substituted methylene group, halomethylene group or haloalkyl group, with the proviso that the term "lower alkyl group" as used herein is meant to indicate a $C_{1-4}$ alkyl group;

$R^{124}$ to $R^{127}$ may be the same or different and each represent a hydrogen atom or alkyl group;

$R^{135}$ to $R^{137}$ may be the same or different and each represent a hydrogen atom, alkyl group, alkoxy group, acyl group or acyloxy group;

$R^{142}$ represents a hydrogen atom, —$R^0$—COO—C($R^{01}$)($R^{02}$)($R^{03}$), —CO—O—C($R^{01}$)($R^{02}$)($R^{03}$) or

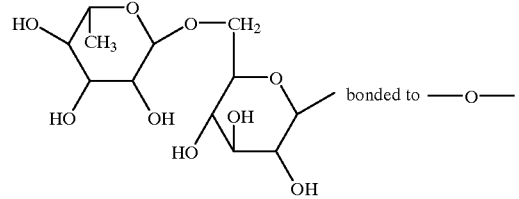

$R^{144}$ and $R^{145}$, which may be the same or different, each represents a hydrogen atom, a lower alkyl group, a lower haloalkyl group or an aryl group, $R^{146}$ to $R^{149}$ may be the same or different and each represent a hydrogen atom, hydroxyl group, halogen atom, nitro group, cyano group, carbonyl group, alkyl group, alkoxy group, alkoxycarbonyl group, aralkyl group, aralkyloxy group, acyl group, acyloxy group, alkenyl group, alkenyloxy group, aryl group, aryloxy group or aryloxycarbonyl group, with the proviso that the four substituents having the same symbol may be the same or different;

Y represents —CO— or —SO$_2$—,

Z and B each represent a single bond or —O—;

A represents a methylene group, lower alkyl-substituted methylene group, halomethylene group or haloalkyl group, E represents a single bond or an oxymethylene group, with the proviso that when a to z, and a1 to y1 are plural, the groups in parenthesis may be the same or different;

a to q, s, t, v, g1 to i1, k1 to m1, o1, q1, s1 and u1 each represent 0 or an integer of from 1 to 5;

r, u, w, x, y, z, a1 to f1, p1, r1, t1, and v1 to x1 each represent 0 or an integer of from 1 to 4; and j1, n1, z1, a2, b2, c2, and d2 each represent 0 or an integer of from 1 to 3, with the proviso that at least one of z1, a2, c2 and d2 represents an integer of not less than 1, y1 represents an integer of 3 to 8, and all these suffixes satisfy the following relationships:

(a+b), (e+f+g), (k+1+m), (q+r+s), (w+X+y), (c1+d1), (g1+h1+i1+j1), (o1+p1) or (s1+t1)≧2, (j1+n1)≦3, (r+u), (w+z), (x+a1), (y+b1), (c1+e1), (d1+f1), (p1+r1), (t1+w1), (x1+w1)≧4.

With respect to formula (V), (w+z), (x+a1)≦5. (a+c), (b+d), (e+h), (f+i), (g+j), (k+n), (l+o) (m+p) , (q+t) (s+v), (g1+k1) (h1+l1), (i1+m1) (o1+q1), (s1+u1)≦5.

[XIII]

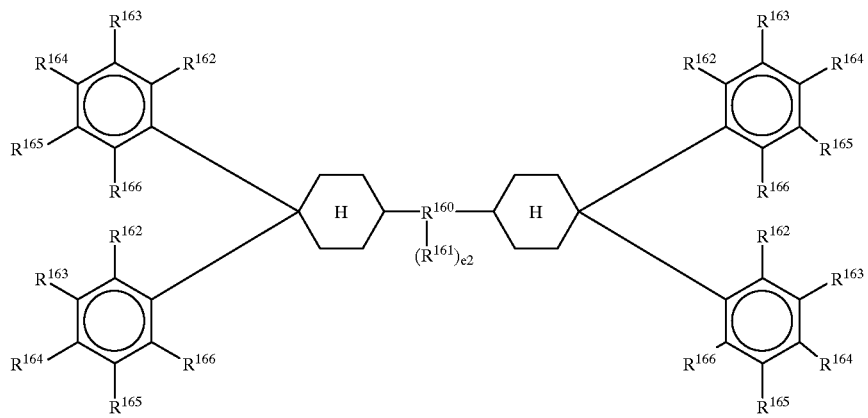

wherein represents an organic group, singlebond, —S—, —SO—

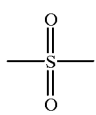

$R^{161}$ represents a hydrogen atom, monovalent organic group or

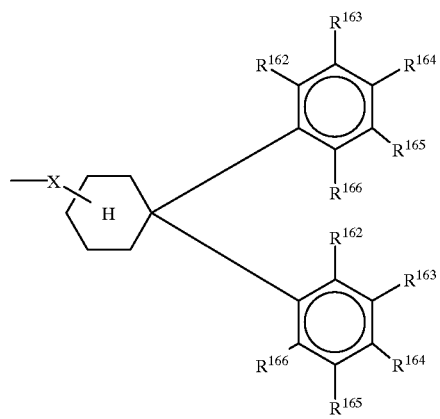

wherein $R^{162}$ to $R^{166}$ may be the same or different and each hydrogen atom, hydroxyl group, halogen atom, alkyl group, alkoxy group, alkenyl group, —O—$R^0$—COO—C($R^{01}$)($R^{02}$)($R^{03}$) or —O—CO—O—C($R^{01}$)($R^{02}$)($R^{03}$) with the proviso that at least two of $R^{162}$ to $R^{166}$ each are —O—$R^0$—COO—C($R^{01}$)($R^{02}$)($R^{03}$) or —O—CO—O—C($R^{01}$)($R^{02}$)($R^{03}$) and the four or six substituents having the same symbol may be the same or different; X represents a divalent organic group; and e2 represents 0 or 1,

[XIV]

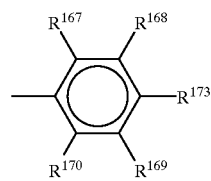

wherein $R^{167}$ to $R^{170}$ may be the same or different and each represent a hydrogen atom, hydroxyl group, halogen atom, alkyl group, alkoxy group or alkenyl group, with the proviso that the four to six substituents having the same symbol may be the same or different; $R^{171}$ and $R^{172}$ each represent a hydrogen atom, alkyl group or at least two of $R^{173}$'s each represent —O—$R^0$—COO—C($R^{01}$)($R^{02}$)($R^{03}$) or —O—CO—O—C($R^{01}$)($R^{02}$)($R^{03}$) group and the other each represent a hydroxyl group; f2 and h2 each represent 0 or 1; and g2 represents 0 or an integer of from 1 to 4.

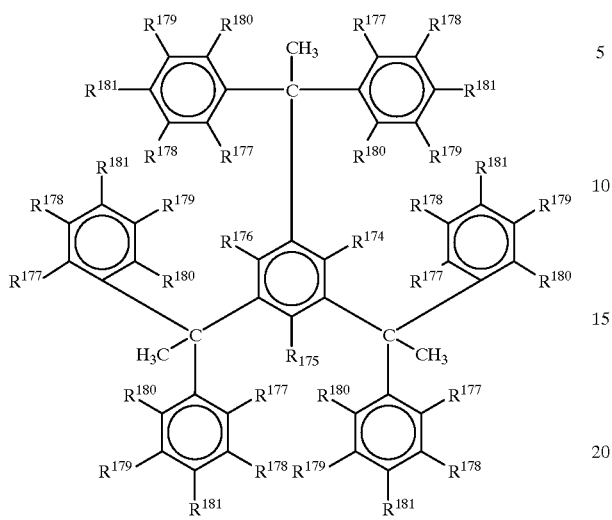

[XV]

wherein $R^{174}$ to $R^{180}$ may be the same or different and each represent a hydrogen atom, hydroxyl group, halogen atom, alkyl group, alkoxy group, nitro group, alkenyl group, aryl group, aralkyl group, alkoxycarbonyl group, arylcarbonyl group, acyloxy group, acyl group, aralkyloxy group or aryloxy group, with the proviso that the six substituents having the same symbol may be the same or different; and at least two of $R^{181}$'s each represent —O—$R^0$—COO—C($R^{01}$)($R^{02}$)($R^{03}$) or —O—CO—O—C($R^{01}$)($R^{02}$)($R^{03}$) group and the other each represent a hydroxyl group.

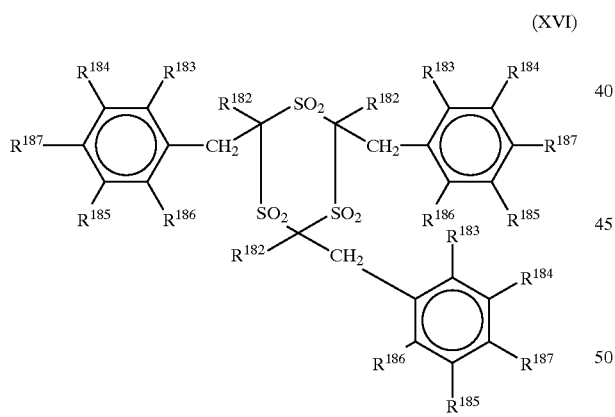

(XVI)

$R^{182}$'s may be the same or different and each represents a hydrogen atom or an alkyl group, $R^{183}$ to $R^{186}$ each represents a hydroxy group, a hydrogen atom, a halogen atom, an alkyl group, or an arkoxy group, and three of each of $R^{183}$ to $R^{186}$ may the same or different, and at least two of $R^{187}$ are —O—$R^0$—COO—C($R^{01}$)($R^{02}$)($R^{03}$) or —O—CO—O—C($R^{01}$)($R^{02}$)($R^{03}$) and the remaining $R^{187}$ is a hydroxy group.

Specific examples of preferred compound skeletons will be given below.

(1)

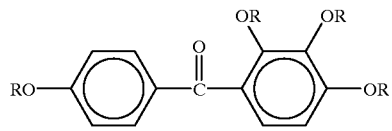

(2)

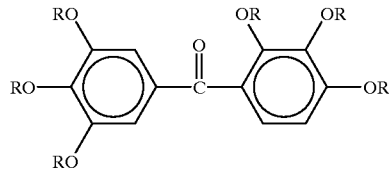

(3)

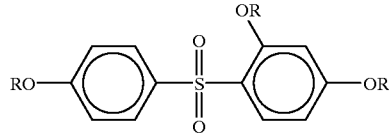

(4)

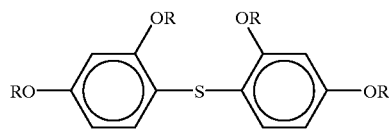

(5)

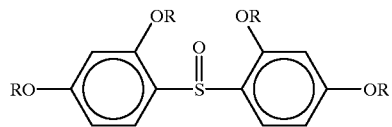

(6)

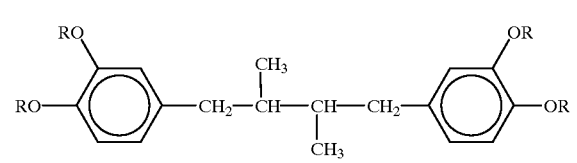

(7)

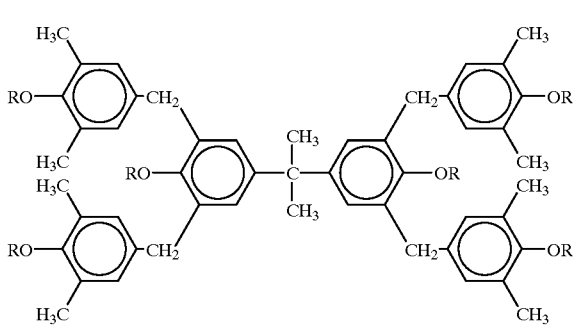

(8)

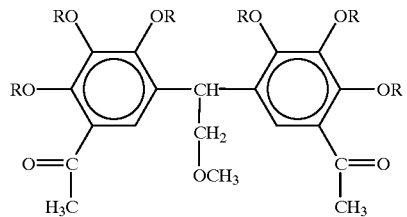

(9)
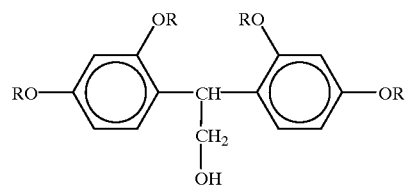
(10)
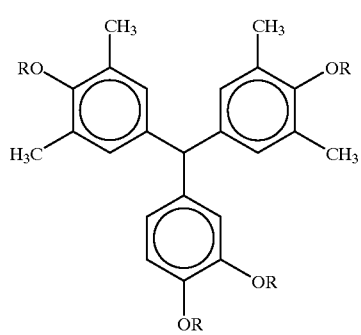
(11)
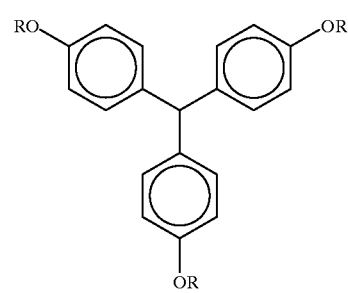
(12)
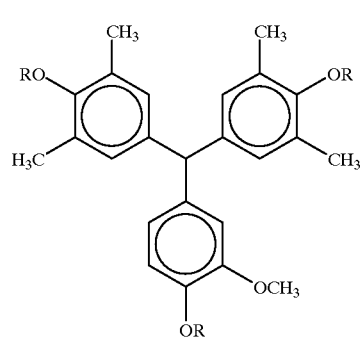
(13)
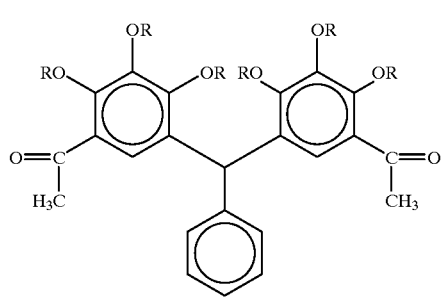
(14)
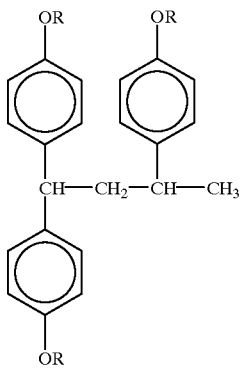
(15)
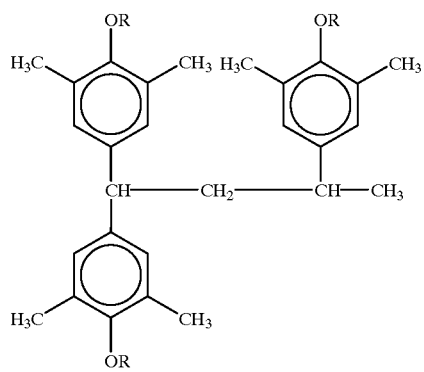
(16)
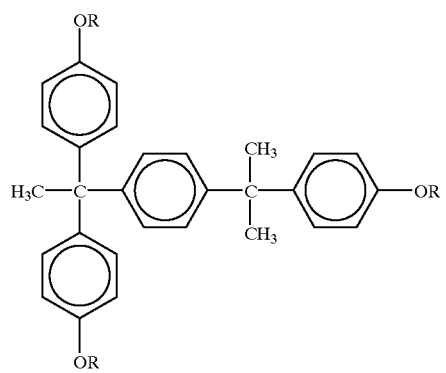
(17)
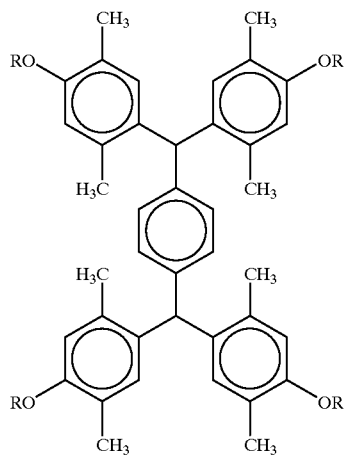

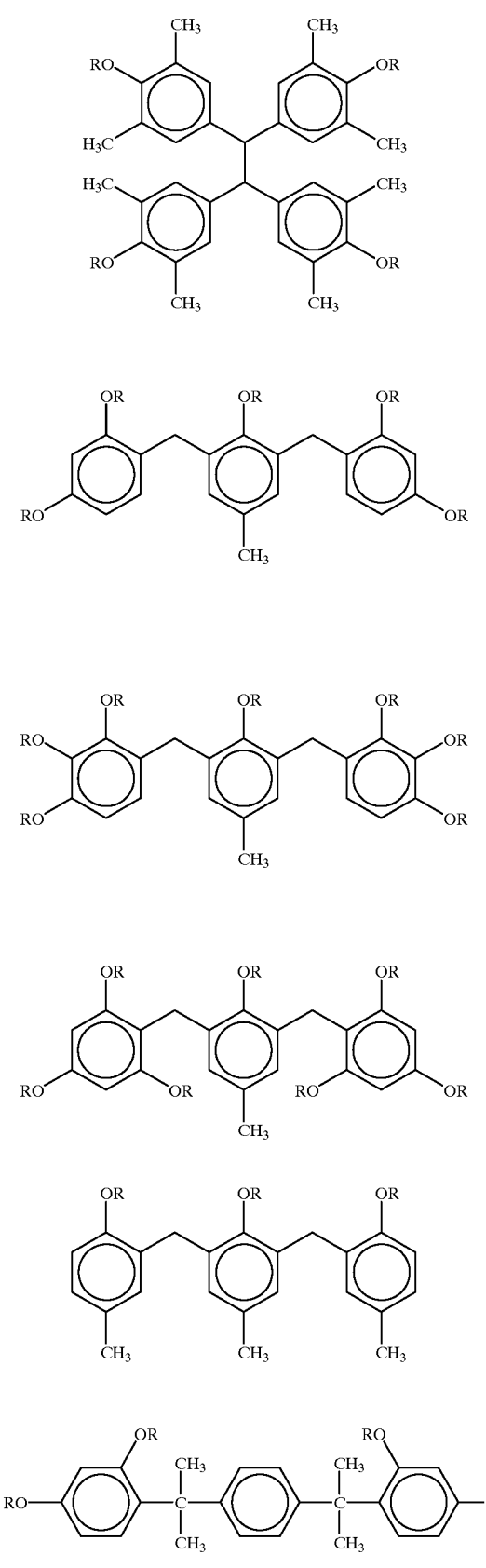

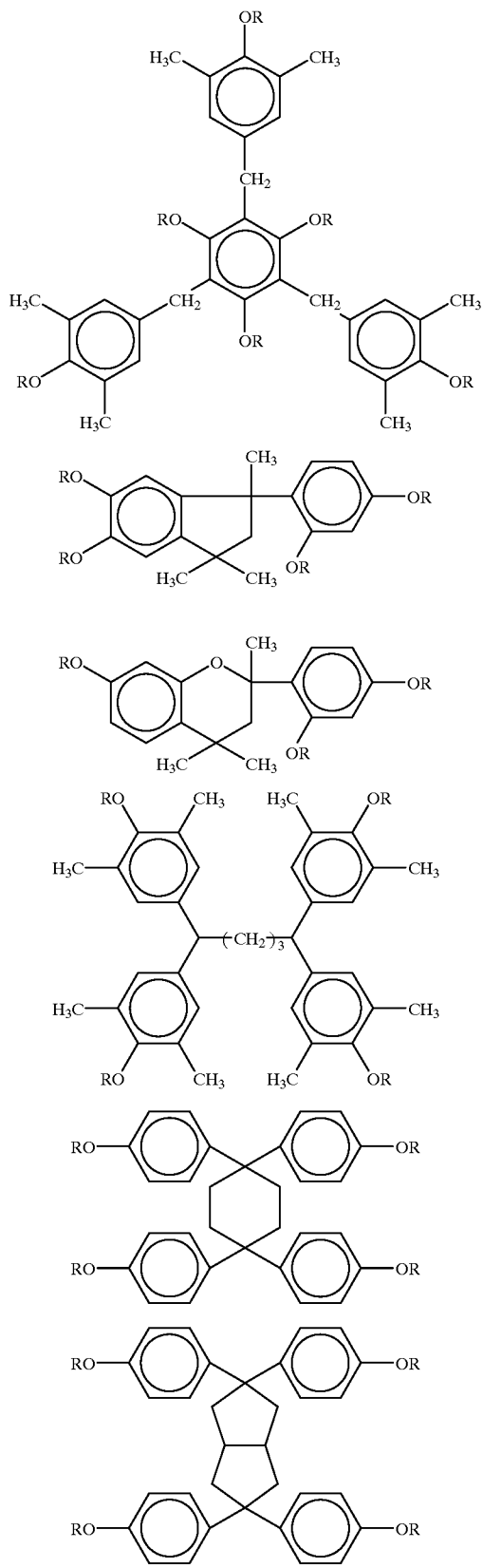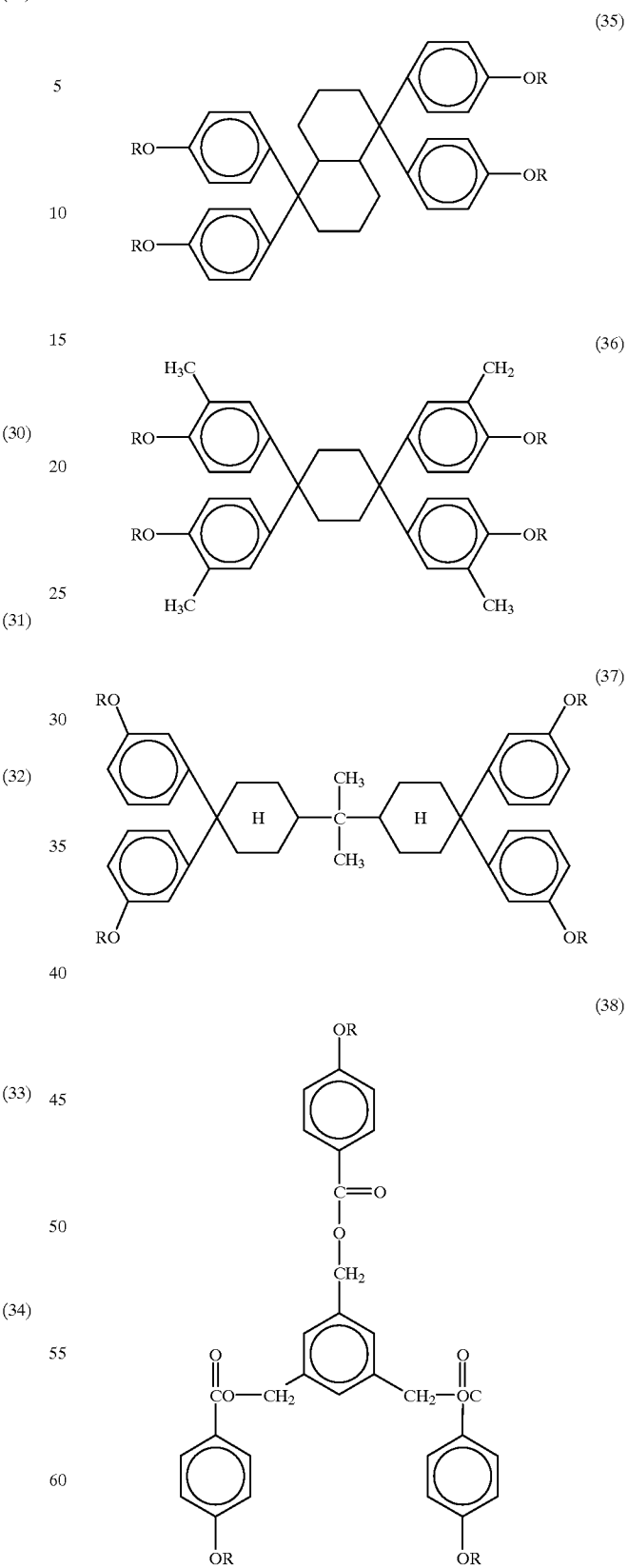

(39)
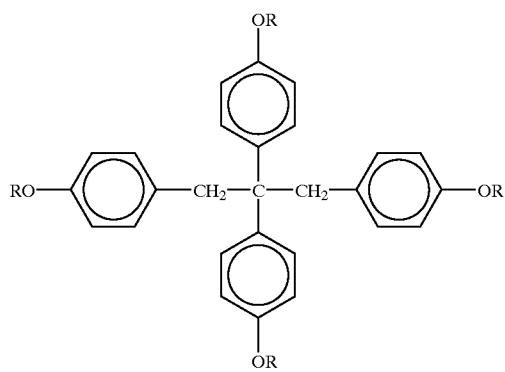

(40)
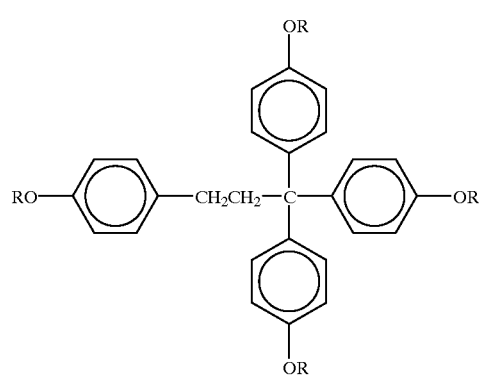

(41)
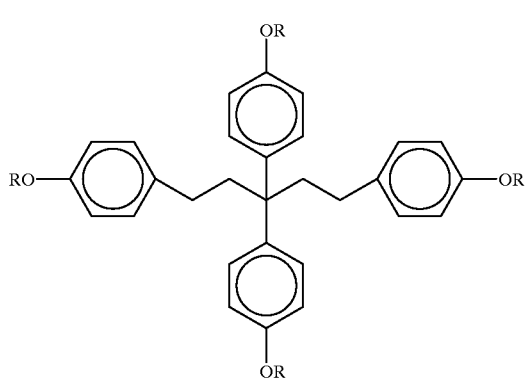

(42)
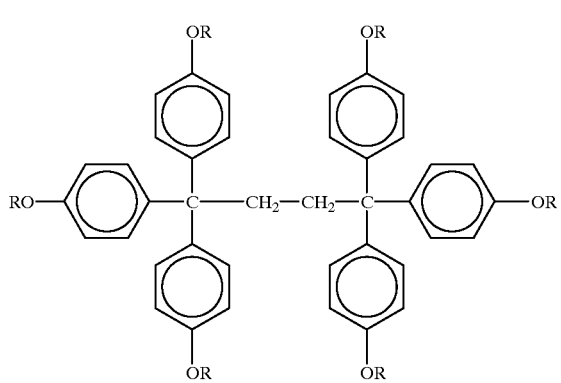

(43)
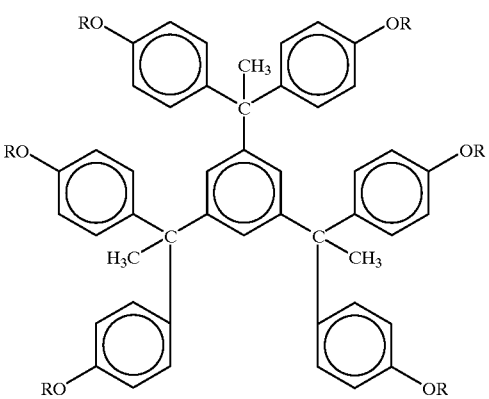

(44)
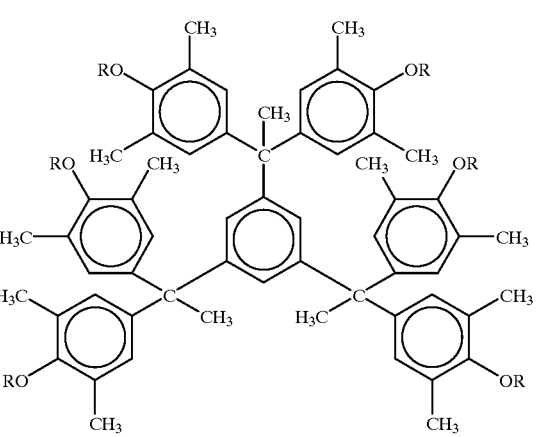

In the foregoing general formulae (1) to (44), R represents a hydrogen atom,

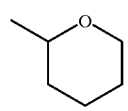

with the proviso that at least two or three, depending on the structure, of R's are groups other than hydrogen atom and the various substituents R may be the same or different.

[VI] Resin (e) Insoluble in Water But Soluble in Alkaline Developer

The positive-working electron beam or X-ray resist composition of the present invention may comprise a water-insoluble and alkaline developer-soluble resin (hereinafter occasionally referred to as "component (e)") incorporated therein. In the case where component (e) is incorporated into the composition, the composition does not have to contain component (b), though it may contain component (b) in combination with component (e).

Examples of the component (e) include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymer, o/p- or m/p-hydroxystyrene copolymer, product of partial O-alkylation of hydroxyl group in polyhydroxystyrene (e.g., 5 to 30 mol % O-methylation product, O-(1-methoxy) ethylation product, O-(1-ethoxy)ethylation product, O-2-tetrahydropyranylation product, O-(t-butoxycarbonyl) methylation product), product of partial O-acylation of hydroxyl group in polyhydroxystyrene (e.g., 5 to 30 mol % O-acetylation product, O-(t-butoxy)carbonylation product), styrene-maleic anhydride copolymer, styrene-hydroxystyrene copolymer, α-methylstyrene-hydroxystyrene copolymer, carboxyl group-containing methacrylic resin, derivative thereof, and polyvinyl alcohol derivative. However, the present invention is not limited to these compounds.

Particularly preferred among these alkali-soluble resins are novolak resin, o-polyhydroxystyrene, m-polyhydroxystyrene, p-polyhydroxystyrene, copolymer thereof, alkyl-substituted polyhydroxystyrene, partial O-alkylation product of polyhydroxystyrene, partial O-acylation product of polyhydroxystyrene, styrene-hydroxystyrene copolymer, and α-methylstyrene-hydroxystyrene copolymer. The foregoing novolak resin can be obtained by allowing a specific monomer as a main component to undergo addition condensation reaction with aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred among these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is preferably from 1,000 to 30,000. If the weight-average molecular weight thereof is lower than 1,000, a considerable proportion of unexposed areas of a resist film dissolve away during development. If the weight-average molecular weight thereof exceeds 30,000, too low a developing rate results. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of generally 2,000 or higher, preferably from 5,000 to 200,000, more preferably from 5,000 to 100,000.

Weight-average molecular weight herein means that determined by gel permeation chromatography and calculated for standard polystyrene.

In the present invention, those alkali-soluble resins (e) may be used as a mixture of two or more thereof.

Two or more of these alkali-soluble resins of the present invention may be used in admixture. The amount of the alkali-soluble resin to be used is generally from 40 to 97% by weight, preferably from 60 to 90% by weight based on the total weight of the solid components of the photosensitive composition.

[VII] Other Components Employable in the Present Invention

The positive-working photosensitive composition of the present invention may further comprise a dye, a pigment, a plasticizer, a surfactant, a photosensitizer, an organic basic compound, a compound containing two or more phenolic OH groups which accelerate solubility in a developer, etc. incorporated therein as necessary.

The compound containing two or more phenolic OH groups employable herein is preferably a phenol compound having a molecular weight of not more than 1,000. The phenol compound needs to contain at least two phenolic hydroxyl groups in its molecule. However, if the number of phenolic hydroxyl groups contained in the phenol compound exceeds 10, the desired effect of improving development latitude is lost. Further, if the ratio of phenolic hydroxyl group to aromatic ring falls below 0.5, the resulting dependence on the film thickness is too great and the development latitude tends to narrow. On the contrary, if this ratio exceeds 1.4, the resulting photosensitive composition exhibits a deteriorated stability, making it difficult to obtain a high resolution and a good dependence on the film thickness.

The added amount of the phenolic compound is preferably from 2 to 50% by weight, more preferably from 5 to 30% by weight based on the weight of the alkali-soluble resin (e). If the added amount of the phenolic compound exceeds 50% by weight, it increases development residue, and a new defect occurs that the pattern is deformed during development.

The synthesis of the phenol compound having a molecular weight of not more than 1,000 can be easily accomplished by those skilled in the art in accordance with the method described in JP-A-4-122938, JP-A-2-28531, U.S. Pat. No. 4,916,210, and European Patent 219,294.

Specific examples of the phenol compound will be given below, but the present invention should not be construed as being limited thereto.

Resorcin, phloroglucine, 2,3,4-trihydroxybenzophenone, 2,3,4,4'-tetrahydroxybenzophenone, 2,3,4,3',4",5'-hexahydroxybenzophenone, acetone-pyrogallol condensed resin, phloroglucoside, 2,4,2',4'-biphenyltetrol, 4,4'-thiobis (1,3-dihydroxy) benzene, 2,2',4,4'-tetrahydroxydiphenylether, 2,2',4,4'-tetrahydroxy diphenylsulfoxide, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl) cyclohexane, 4,4-(α-methylbenzylidene)bisphenol, α,α',α''-tris (4-hydroxyphenyl)-1,3,5-triisopropylbenzene, α, α',α''-tris (4-hydroxyphenyl)-1-ethyl-4-isopropylbenzene, 1,2,2-tris (hydroxyphenyl)propane, 1,1,2-tris(3,5-dimethyl-4-hydroxy phenyl)propane, 2,2,5,5-tetrakis(4-hydroxyphenyl) hexane, 1,2-tetrakis(4-hydroxyphenyl)ethane, 1,1,3-tris (hydroxyphenyl)butane, and para[α,α,α',α'-tetrakis(4-hydroxyphenyl)]-xylene.

Preferred organic basic compounds usable in the present invention are compounds which are more strongly basic than phenol. Especially preferred among these are nitrogen-containing basic compounds.

Preferred chemical environments include structures represented by the following formulae (A) to (E).

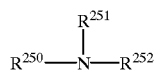

(A)

In formula (A) $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

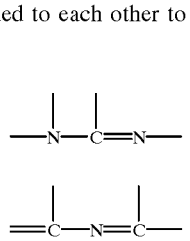

(B)

(C)

(D)

(E)

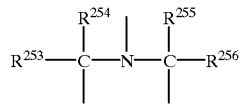

(In formula (E), $R^{253}$, $R^{254}$, $R^{255}$, and $R^{256}$ may be the same or different and each represents an alkyl group having 1 to 6 carbon atoms.)

More preferred organic basic compounds are nitrogen-containing basic compounds having, per molecule, two or more nitrogen atoms having different chemical environments. Most preferred are compounds containing both at least one substituted or unsubstituted amino group and at least one nitrogen-containing ring structure and compounds having at least one alkylamino group. Preferred examples of such compounds include substituted or unsubstituted guanidine, substituted or unsubstituted aminopyridine, substituted or unsubstituted aminoalkylpyridines, substituted or unsubstituted aminopyrrolidine, substituted or unsubstituted imidazole, substitutedorunsubstitutedpyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of the most preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,8-diazabicyclo[5,4,0]undec-7-ene, 1,5-diazabicyclo[4,3,0] non-5-ene, 2,4,5-triphenylimidazole, and N-cyclohexyl-N'-morpholinoethylthiourea. Particularly preferred are 1,8-diazabicyclo[5,4,0]undec-7-ene, 1,5-diazabicyclo[4,3,0] non-5-ene, 2,4,5-triphenylimidazole, and N-cyclohexyl-N'-morpholinoethylthiourea. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the aforementioned effects cannot be obtained. On the other hand, amounts thereof exceeding 10 parts by weight tend to result in reduced sensitivity and impaired development resistance of unexposed areas.

The photosensitive composition of the present invention may be applied to the support in the form of solution in a solvent capable of dissolving the various components therein. Preferred examples of the solvent employable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofurane. These solvents may be used singly or in admixture.

A surfactant other than the fluorine and/or silicon surfactant being component (c) can be further incorporated. Specific examples of the surfactant employable herein include nonionic surfactants such as polyoxyethylene alkyl ether (e.g., polyoxyethylene lauryl ether, polyoxyethylene stearyl ether, polyoxyethylene cetyl ether, polyoxyethylene oleyl ether), polyoxyethylene alkyl allyl ether (e.g., polyoxyethylene octyl phenol ether, polyoxyethylene nonyl phenol ether), polyoxyethylene-polyoxypropylene block copolymer, sorbitan aliphatic acid ester (e.g., sorbitan monolaurate, sorbitan monopalmitate, sorbitan monostearate, sorbitan monoleate, sorbitan trioleate, sorbitan tristearate) and polyoxyethylenesorbitan aliphatic acid ester (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), and acrylic or methacrylic acid (co)polymer Polyflow Nos. 75 and 95 (produced by Kyoeisha Chemical Co., Ltd.). The blended amount of such a surfactant is normally not more than 2 parts by weight, preferably not more than 1 part by weight based on 100 parts by weight of the solid content in the photosensitive composition of the present invention.

These surfactants may be used singly. Alternatively, some of these surfactants may be used in combination.

The photosensitive composition thus obtained may be applied to a substrate (e.g., silicon/silicon dioxide-coated substrate) for use in the production of precision integrated circuit device by means of an appropriate coating means such as spinner and coater, exposed to light through a predetermined mask, baked, and then developed to obtain a good resist pattern.

As the developer for the photosensitive composition of the present invention there may be used an aqueous solution of an alkaline material such as inorganic alkali (e.g., sodium hydroxide, potassium hydroxide, sodium carbonate, sodium silicate, sodium metasilicate, aqueous ammonia), primary amine (e.g., ethylamine, n-propylamine), secondary amine (e.g., diethylamine, di-n-butylamine), tertiary amine (e.g., triethylamine, methyldiethylamine), alcoholamine (e.g., dimethylethanolamine, triethanolamine), quaternary ammonium salt (e.g., tetramethylammonium hydroxide, tetraethylammonium hydroxide) and cyclic amine (e.g., pyrrole, piperidine).

The foregoing alkaline aqueous solution may comprise alcohols and surfactants incorporated therein in a proper amount.

EXAMPLES

The present invention will be further illustrated in greater detail with reference to the following examples, which are, however, not to be construed as limiting the scope of the invention.

Synthesis Example 1: Synthesis of Poly(p-hydroxystyrene/styrene) Copolymer

In 100 ml of tetrahydrofuran, 35.25 g (0.2 mol) of a p-tert-butoxystyrene monomer and 5.21 g (0.05 mol) of a styrene monomer which were dehydrated and purified by distillation in the usual way were dissolved. Then, 0.033 g of azobisisobutyronitrile (AIBN) was added 3 times at intervals of 2.5 hours at 80° C. in a stream of nitrogen with stirring, and finally, stirring was further continued for 5 hours, thereby conducting a polymerization reaction. The reaction solution was poured into 1,200 ml of hexane to precipitate a white resin. The resulting resin was dried, and then dissolved in 150 ml of tetrahydrofuran.

4 N hydrochloric acid was added thereto, and after hydrolysis by heat reflux for 6 hours, the resin was reprecipitated in 5 liters of extrapure water. Then, the resin was separated by filtration, washed with water and dried. The resin was further dissolved in 200 ml of tetrahydrofuran, and the resulting solution was added dropwise to 5 liters of extrapure water with vigorous stirring to reprecipitate the resin. This reprecipitation operation was repeated 3 times. The resulting resin was dried in a vacuum desiccator at 120° C. for 12 hours to obtain a poly(p-hydroxystyrene/styrene) copolymer.

Synthesis Example 2: Synthesis of Resin Example (b-21)

In 120 ml of butyl acetate, 32.4 g (0.2 mol) of p-acetoxystyrene and 7.01 g (0.07 mol) of t-butyl methacrylate were dissolved. Then, 0.033 g of azobisisobutyronitrile (AIBN) was added 3 times at intervals of 2.5 hours at 8° C. in a stream of nitrogen with stirring, and finally, stirring was further continued for 5 hours, thereby conducting a polymerization reaction. The reaction solution was poured into 1,200 ml of hexane to precipitate a white resin. The resulting resin was dried, and then dissolved in 200 ml of methanol.

An aqueous solution of 7.7 g (0.19 mol) of sodium hydroxide in 50 ml of water was added thereto, and hydrolysis was conducted by heat reflux for 1 hour. Then, 200 ml of water was added to the resulting solution to dilute it, followed by neutralization with hydrochloric acid to precipitate a white resin. This resin was separated by filtration, washed with water and dried. The resin was further dissolved in 200 ml of tetrahydrofuran, and the resulting solution was added dropwise to 5 liters of extrapure water with vigorous stirring to reprecipitate the resin. This reprecipitation operation was repeated 3 times. The resulting resin was dried in a vacuum desiccator at 120 ° C for 12 hours to obtain a poly(p-hydroxystyrenelt-butyl methacrylate) copolymer.

Synthesis Example 3: Synthesis of Resin Example (b-3)

In 50 ml of pyridine, 10 g of poly(p-hydroxystyrene) (VP-8000, manufactured by Nippon Soda Co., Ltd.) was dissolved, and 3.63 g of di-t-butyl dicarbonate was added dropwise thereto at room temperature with stirring.

After stirring at room temperature for 3 hours, the resulting solution was added dropwise to a solution of 20 g of concentrated hydrochloric acid in 1 liter of ion-exchanged water. A powder precipitated was filtered, washed with water and dried to obtain resin example (b-3).

Synthesis Example 4: Synthesis of Resin Example (b-33)

In 300 ml of toluene, 83.1 g (0.5 mol) of p-cyclohexylphenol was dissolved, and then 150 g of 2-chloroethyl vinyl ether, 25 g of sodium hydroxide, 5 g of tetrabutylammonium bromide and 60 g of triethylamine were added thereto, followed by a reaction at 120° C. for 5 hours. The reaction solution was washed with water, and excess chloroethyl vinyl ether and toluene were removed by distillation. The resulting oil was purified by distillation under reduced pressure to obtain 4-cyclohexylphenoxyethyl vinyl ether.

In 80 ml of THF, 20 g of poly(p-hydroxystyrene) (VP-8000, manufactured by Nippon Soda Co., Ltd.) and 6.5 g of 4-cyclohexylphenoxyethyl vinyl ether were dissolved, and 0.01 g of p-toluenesulfonic acid was added thereto, followed by a reaction at room temperature for 18 hours. The reaction solution was added dropwise to 5 liters of distilled water with vigorous stirring, and a powder precipitated was filtered and dried to obtain resin example (b-33).

Resin examples (b-4), (b-28) and (b-30) were synthesized by similar methods using corresponding stem polymers and vinyl ethers.

Synthesis Example 1 of Dissolution Inhibitive Compound: Synthesis of Compound Example 16

In 300 ml of N,N-dimethylacetamide, 42.4 g of 1-[α-methyl-α-(4'-hydroxyphenyl)ethyl]-4-[α',α'-bis(4''-hydroxyphenyl)ethyl]benzene was dissolved, and 49.5 g (0.35 mol) of potassium carbonate and 84.8 g (0.33 mol) of cumyl bromoacetate were added thereto. Then, the resulting solution was stirred at 120° C. for 7 hours. The reaction mixture was poured into 2 liters of ion-exchanged water, and neutralized with acetic acid, followed by extraction with ethyl acetate. The ethyl acetate extract was concentrated and purified to obtain compound example 16 (each R is —$CH_2COOC(CH_3)_2C_6H_5$).

Synthesis Example 2 of Dissolution inhibitive Compound: Synthesis of Compound Example 41

In 250 ml of N,N-dimethylacetamide, 44 g of 1,3,3,5-tetrakis-(4-hydroxyphenyl)pentane was dissolved, and 70.7 g of potassium carbonate was added thereto. Then, 90.3 g of t-butyl bromoacetate was added, followed by stirring at 120° C. for 7 hours. The reaction mixture was poured into 2 liters of ion-exchanged water, and the resulting viscous material was washed with water. This was purified by column chromatography to obtain 87 g of compound example 41 (each R is —$CH_2COOC_4H_9$ (t)).

Synthesis Example 3 of Dissolution Inhibitive Compound: Synthesis of Compound Example 43

In 400 ml of diethyl ether, 20 g of α,α,α',α',α'',α''-hexakis(4-hydroxyphenyl)-1,3,5-triethylbenzene was dissolved. To this solution, 42.4 g of 3,4-dihydro-2H-pyran and a catalytic amount of hydrochloric acid were added under an atmosphere of nitrogen, followed by reflux for 24 hours. After the reaction was completed, a small amount of sodium hydroxide was added, followed by filtration. The filtrate was concentrated and purified by column chromatography to obtain 55.3 g of compound example 43 (each R is a THP group).

Examples 1 to 16 and Comparitive Examples 1 to 5

Components shown in Table 1 given below were each dissolved in 8.2 g of propylene glycol monomethyl ether acetate, and the resulting solutions were each filtered through a 0.1-μm Teflon filter to prepare resist solutions.

For the resin compositions thus prepared, the number of development defects and the image performance of resists were evaluated by electron beam irradiation according to the following methods. Results of evaluation thereof are shown in Table 2.

Evaluation by Electron Beam Exposure Methods for Evaluating Number of Development Defects (1) Number of Development Defects-I A photosensitive resin composition was uniformly applied onto a silicon substrate treated with hexamethyldisilazane, by means of a spin coater, and heated and dried on a hot plate at 120° C. for 60 seconds to form a 0.8-μm thick resist film. This film was exposed with an electron beam plotting device (accelerating voltage: 50 KeV, beam diameter: 0.20 μm), and immediately after exposure, it was heated on a hot plate at 110° C. for 90 seconds. Further, the resist film was developed with an aqueous solution of tetramethylammonium hydroxide having a concentration of 2.38% by weight at 23° C. for 60 seconds, and rinsed with pure water for 30 seconds, followed by drying. For a sample thus obtained on which a contact hole pattern was formed, the number of development defects was measured with a KLA 2112 device (manufactured by KLA Tencall Co.) (Threshold 12, Pixcel Size=0.39).

(2) Number of Development Defects-II

For a sample heated, developed, rinsed and dried in the same manner as with the measurement of the number of development defects I described in the above (1) with the exception that the sample was not exposed, the number of development defects was measured.

Image Evaluation Method

A 0.8-μm thick resist film was formed in the same manner as with the measurement of the number of development defects I described in the above (1), and this film was exposed, heated, developed, rinsed and dried.

Then, the film thickness was measured with a film thickness gauge, and the residual film rate was calculated. Further, a 0.2-μm contact hole pattern formed was observed under a scanning electron microscope to examine a profile.

Sensitivity Evaluation Method

The sensitivity was evaluated by an exposure amount for reproducing a 0.20-μm contact hole pattern.

Resolution Evaluation Method

The resolution is a threshold resolution at the exposure amount for reproducing a 0.20-μm contact hole pattern.

TABLE 1

| Example | Acid-Generator | | Binder | | Surfactant | | Organic Basic Compound | | Dissolution Inhibitive Compound | |
|---|---|---|---|---|---|---|---|---|---|---|
| 1 | (I-1) | 0.09 g | (b-3) | 1.71 g | (W-1) | 0.01 g | TPI | 0.009 g | | |
| 2 | (I-8) | 0.09 g | (b-22) | 1.71 g | (W-2) | 0.01 g | DBN | 0.009 g | | |
| 3 | (I-9) | 0.09 g | (b-21) | 1.71 g | (W-3) | 0.01 g | DMAP | 0.009 g | | |
| 4 | (II-1) | 0.09 g | (PHS) | 1.37 g | (W-1) | 0.01 g | TPI | 0.009 g | 41 (TBE) | 0.34 g |
| 5 | (II-3) | 0.09 g | (b-30) | 1.71 g | (W-2) | 0.01 g | CHMETU | 0.009 g | | |
| 6 | (II-4) | 0.09 g | (b-4) | 1.37 g | (W-3) | 0.01 g | — | | 16 (CE) | 0.34 g |
| 7 | (III-1) | 0.09 g | (b-28) | 1.71 g | (W-1) | 0.01 g | TPI | 0.009 g | | |
| 8 | (III-4) | 0.09 g | (PHS/St) | 1.37 g | (W-2) | 0.01 g | DMAP | 0.009 g | 43 (THP) | 0.34 g |
| 9 | (I-9) (II-1) | 0.09 g | (b-3) | 1.71 g | (W-5) | 0.01 g | TPI | 0.009 g | | |

TABLE 1-continued

| | Acid-Generator | | Binder | | Surfactant | Organic Basic Compound | Dissolution Inhibitive Compound |
|---|---|---|---|---|---|---|---|
| 10 | Mixture (I-1) (III-1) | 0.045 g 0.045 g | (b-22) | 1.71 g | (W-2) 0.01 g DBN | 0.009 g | |
| 11 | (III-1) | 0.12 g | (b-21) | 1.71 g | (W-3) 0.01 g TPI | 0.015 g | |
| 12 | (IV-1) | 0.09 g | (PHS) | 1.37 g | (W-1) 0.01 g | | 43 (TBE) 0.34 g |
| 13 | (V-1) | 0.09 g | (b-30) | 1.71 g | (W-2) 0.01 g CHMETU | 0.009 g | |
| 14 | (VI-1) | 0.09 g | (b-4) | 1.37 g | (W-3) 0.01 g DMAP | 0.009 g | |
| 15 | (VII-1) | 0.09 g | (b-31) | 1.71 g | (W-1) 0.01 g TPI | 0.009 g | |
| 16 | (I-15) | 0.09 g | (PHS/St) | 1.37 g | (W-5) 0.01 g TPI | 0.009 g | 16 (TBE) 0.28 g |
| Comparative Example | | | | | | | |
| 1 | (PAG-1) | 0.09 g | (b-28) | 1.71 g | (W-1) 0.01 g TPI | 0.009 g | |
| 2 | (PAG-2) | 0.09 g | (b-22) | 1.71 g | (W-2) 0.01 g DBN | 0.009 g | |
| 3 | (I-1) | 0.09 g | (b-3) | 1.71 g | (W-4) 0.01 g TPI | 0.009 g | |
| 4 | (II-1) | 0.09 g | (PHS) | 1.37 g | (W-4) 0.01 g TPI | 0.009 g | 41 (TBE) 0.34 g |
| 5 | (PAG-1) | 0.09 g | (b-3) | 1.71 g | (W-4) 0.01 g TPI | 0.009 g | |

Photo-acid generators PAG-1 and PAG-2 are as follows:

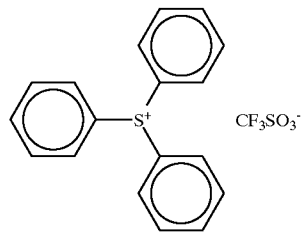

PAG-1

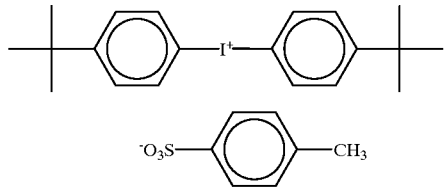

PAG-2

Surfactants (W-1), (W-2), (W-3) and (W-4) areas follows:

W-1: Megafac F176 (manufactured by Dainippon Ink & Chemicals, Inc.)

W-2: Megafac R08 (manufactured by Dainippon Ink & Chemicals, Inc.)

W-3: Polysiloxane Polymer KP-341 (manufactured by Shin-Etsu Chemical Co., Ltd.)

W-4: Polyoxyethylene nonyl phenyl ether

W-5: Troysol S-366 (Troy Chemical Co.)

TPI: 2,4,5-triphenylimidazole

DBN: 1,5-diazabicyclo[4.3.0]nona-5-ene

CHMETU: N-cyclohexyl-N'-morpholinoethylthiourea

The composition and properties of the binder resins used are as follows:

(b-3): p-Hydroxystyrene/p-t-butoxycarboxystyrene copolymer (molar ratio: 80/20), weight average molecular weight: 13,000, molecular weight distribution (Mw/Mn): 1.4

(b-4): p-Hydroxystyrene/p-(1-ethoxyethoxy)styrene copolymer (molar ratio: 70/30), weight average molecular weight: 12,000, molecular weight distribution (Mw/Mn): 1.3

(b-21): p-Hydroxystyrene/t-butyl methacrylate copolymer (molar ratio: 70/30), weight average molecular weight: 16,000, molecular weight distribution (Mw/Mn): 2.0

(b-22): p-Hydroxystyrene/p-(1-t-butoxyethoxy)styrene copolymer (molar ratio: 85/15), weight average molecular weight: 12,000, molecular weight distribution (Mw/Mn): 1.1

(b-28): p-Hydroxystyrene/p-(1-phenethyloxyethoxy)-styrene copolymer (molar ratio: 85/15), weight average molecular weight: 12,000, molecular weight distribution (Mw/Mn): 1.2

(b-30): p-Hydroxystyrene/p-(1-phenoxyethoxyethoxy)-styrene copolymer (molar ratio: 85/15), weight average molecular weight: 13,000, molecular weight distribution (Mw/Mn): 1.2

(PHS): Poly-p-hydroxystyrene (trade name: VP-15000, manufactured by Nippon Soda Co., Ltd.)

(PHS/St: Synthesized in Synthesis Example 1): p-Hydroxystyrene/styrene copolymer (molar ratio: 80/20), weight average molecular weight: 26,000, molecular weight distribution (Mw/Mn): 1.9

TABLE 2

| | Sensitivity (μC) | Resolution (μm) | Pattern Profile | Development Defects I | Development Defects II |
|---|---|---|---|---|---|
| Example 1 | 4 | 0.11 | Rectangle | 3 | 5 |
| Example 2 | 3 | 0.11 | Rectangle | 4 | 7 |
| Example 3 | 4 | 0.12 | Rectangle | 0 | 2 |
| Example 4 | 5 | 0.11 | Rectangle | 0 | 1 |
| Example 5 | 6 | 0.12 | Rectangle | 5 | 8 |
| Example 6 | 1 | 0.12 | Rectangle | 2 | 3 |
| Example 7 | 3 | 0.11 | Rectangle | 3 | 7 |
| Example 8 | 2 | 0.12 | Rectangle | 3 | 9 |
| Example 9 | 4 | 0.11 | Rectangle | 3 | 5 |
| Example 10 | 5 | 0.11 | Rectangle | 4 | 7 |
| Example 11 | 4 | 0.12 | Rectangle | 1 | 5 |
| Example 12 | 6 | 0.11 | Rectangle | 1 | 4 |
| Example 13 | 6 | 0.12 | Rectangle | 5 | 8 |
| Example 14 | 6 | 0.12 | Rectangle | 4 | 3 |
| Example 15 | 5 | 0.11 | Rectangle | 3 | 7 |
| Example 16 | 2 | 0.10 | Rectangle | 3 | 6 |
| Comparative | 9 | 0.15 | Reverse | 15 | 42 |

TABLE 2-continued

| | Sensitivity ($\mu C$) | Resolution ($\mu m$) | Pattern Profile | Development Defects I | Development Defects II |
|---|---|---|---|---|---|
| Example 1 | | | taper | | |
| Comparative Example 2 | 12 | 0.16 | Reverse taper | 10 | 31 |
| Comparative Example 3 | 7 | 0.15 | Somewhat reverse taper | 18 | 51 |
| Comparative Example 4 | 6 | 0.15 | Somewhat reverse taper | 32 | 60 |
| Comparative Example 5 | 6 | 0.17 | Reverse taper | 72 | 192 |

The results shown in Table 2 reveal the following.

The positive-working electron beam resist compositions of the present invention are high in sensitivity and resolution, give the rectangular pattern profiles, and have a small number of development defects.

On the other hand, in the case of Comparative Examples 1 and 2, the surfactants, component (c), compounded in the compositions of the present invention are used, but the photoacid generators other than component (a) are used. As a result, the pattern profiles have a reverse tapered form, and a somewhat large amount of development defects are produced.

In the case of Comparative Examples 3 and 4, the photo-acid generators, component (a), compounded in the compositions of the present invention are used, but the surfactants other than component (c) are used. Accordingly, although the pattern profiles are somewhat improved, a large number of development defects are produced.

Further, in Comparative Example 5, the photo-acid generator other than component (a) and the surfactant other than component (c) are used, so that the pattern profile has a reverse tapered form, and a large amount of development defects are produced.

B. Evaluation by X-ray Exposure

With respect to each of Examples 1 to 8 and Comparative Example 1, components shown Table I were dissolved in 10.2 g of propylene glycol monomethyl ether acetate, and then filtered through a 0.1-$\mu m$ Teflon filter to prepare a resist solution Each resist solution was uniformly applied onto a silicon substrate treated with hexamethyl-disilazane, by means of a spin coater, and heated and dried on a hot plate at 120° C. for 90 seconds to form a 0.35-$\mu m$ thick resist film. This film was exposed with an X-ray exposure apparatus (XRS-200, gap value 20$\mu m$, no magnification), and immediately after exposure, it was heated on a hot plate at 110° C. for 90 seconds. Further, the resist film was developed with an aqueous solution of tetramethylammonium hydroxide having a concentration of 2.38% by weight at 23° C. for 60 seconds, and rinsed with pure water for 30 seconds, followed by drying.

For a sample thus obtained on which a line and space pattern and a contact hole pattern were formed, the sensitivity and resolution were evaluated.

The sensitivity was evaluated by an exposure amount for reproducing a 0.15 $\mu m$ mask pattern.

The resolution represents a threshold resolution at the exposure amount for reproducing a 0.15 $\mu m$ mask pattern.

With respect to the contact hole pattern, the number of development defects was measured with a KLA 2112 device (manufactured by KLA Tencall Co.) (Threshold 12, Pixcel Size=0.39). The obtained results are shown in Table 3 below.

TABLE 3

| | Line and Space | | Contact Hole | | |
|---|---|---|---|---|---|
| | Sensitivity (mJ/cm$^2$) | Resolution ($\mu m$) | Sensitivity (mJ/cm$^2$) | Resolution ($\mu m$) | Development Defects |
| Example 1 | 80 | 0.09 | 90 | 0.10 | 0 |
| Example 2 | 100 | 0.09 | 105 | 0.11 | 3 |
| Example 3 | 90 | 0.10 | 105 | 0.11 | 2 |
| Example 4 | 100 | 0.11 | 110 | 0.11 | 5 |
| Example 5 | 90 | 0.10 | 100 | 0.10 | 2 |
| Example 6 | 95 | 0.10 | 100 | 0.11 | 4 |
| Example 7 | 85 | 0.11 | 90 | 0.11 | 3 |
| Example 8 | 90 | 0.09 | 100 | 0.10 | 1 |
| Comparative Example 1 | 150 | 0.14 | 180 | 0.15 | 36 |

It can be seen from the above results that the resist compositions of the present invention exhibit high sensitivity, high resolution and reduced development defects even in terms of x-ray exposure evaluation.

The positive-working electron beam or X-ray resist compositions of the present invention are high in sensitivity and resolution, can give the excellent rectangular pattern profiles, and have a small number of development defects.

While the invention has been described in detail and with reference to specific embodiments thereof, it will be apparent to one skilled in the art that various changes and modifications can be made therein without departing from the spirit and scope thereof.

What is claimed is:

1. A positive-working electron beam resist composition comprising:

(a) a compound capable of generating an acid by irradiation of an electron beam selected from the group consisting of compounds represented by formulae (I) to (III):

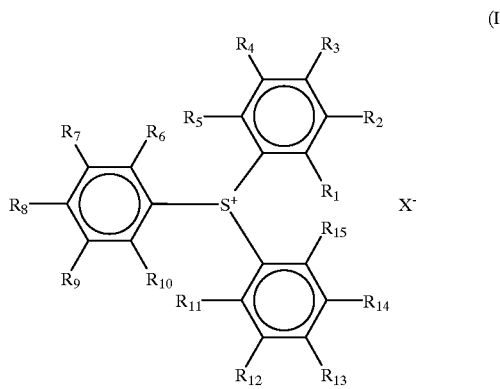

(I)

-continued

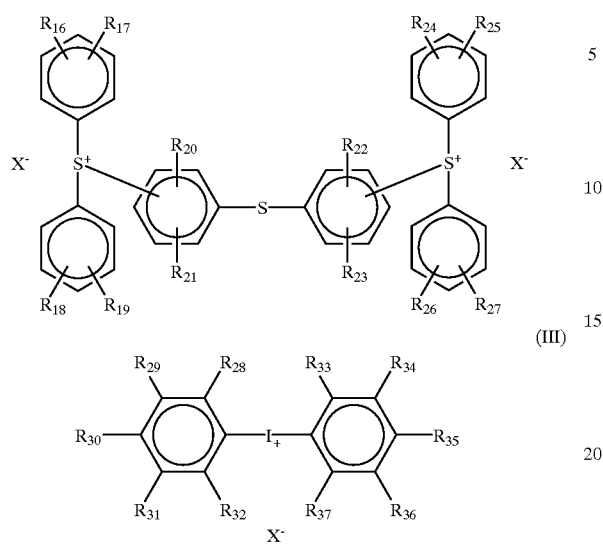

wherein $R_1$ to $R_{37}$, which may be the same or different, each represents a hydrogen atom, a straight-chain, branched or cyclic alkyl group, a straight-chain or cyclic alkoxyl group, a hydroxyl group, a halogen atom or —S—$R_{38}$, wherein $R_{38}$ represents a straight-chain, branched or cyclic alkyl group or an aryl group, and two or more of $R_1$ to $R_{15}$, $R_{16}$ to $R_{27}$ or $R_{28}$ to $R_{37}$ may combine to form a ring containing one or two or more selected from the group consisting of a single bond, carbon, oxygen, sulfur and nitrogen; and $X^-$ represents an anion of benzenesulfonic acid, naphthalenesulfonic acid or anthracenesulfonic acid containing at least one selected from the group consisting of at least one fluorine atom, a straight-chain, branched or cyclic alkyl group substituted by at least one fluorine atom, a straight-chain, branched or cyclic alkoxyl group substituted by at least one fluorine atom, an acyl group substituted by at least one fluorine atom, an acyloxy group substituted by at least one fluorine atom, an alkyl or aryl sulfonyl group substituted by at least one fluorine atom, an alkyl or aryl sulfonyloxy group substituted by at least one fluorine atom, an alkyl or aryl sulfonylamino group substituted by at least one fluorine atom, an aryl group substituted by at least one fluorine atom, an aralkyl group substituted by at least one fluorine atom, and an alkoxycarbonyl group substituted by at least one fluorine atom;

(b) a resin containing a group which is decomposable by action of an acid to increase solubility in an alkali developing solution; and (c) a fluorine and/or silicon surfactant.

2. The positive-working electron beam resist composition according to claim 1, which further comprises (d) a low molecular weight dissolution inhibitive compound having a molecular weight of 3,000 or less which has a group decomposable with an acid and increases the rate of dissolution in the alkali developing solution by action of an acid.

3. The positive-working electron beam resist composition as claimed in claim 1, further comprising an organic basic compound.

4. A positive-working X-ray resist composition comprising:

(a) a compound capable of generating an acid by irradiation of an X-ray selected from the group consisting of compounds represented by formulae (I) to (III):

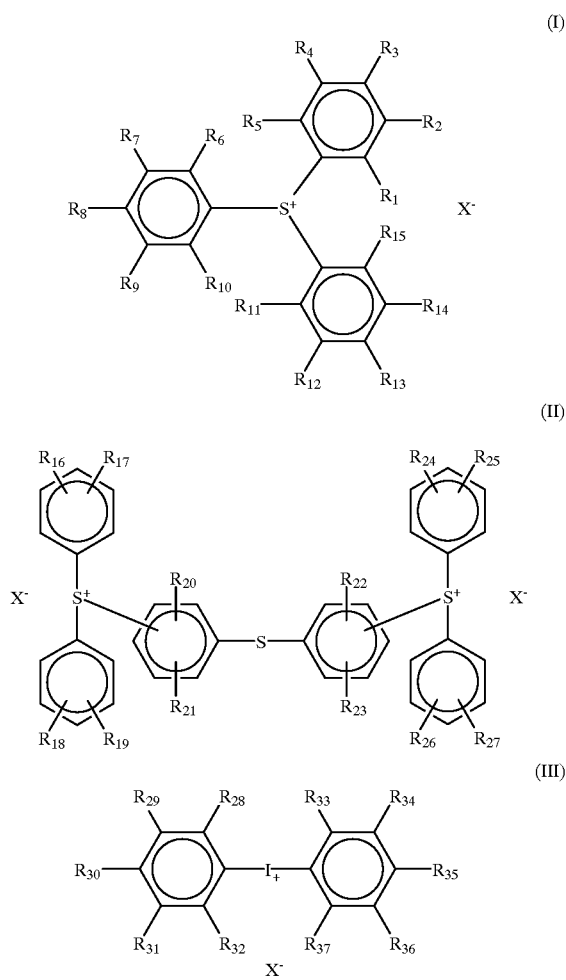

wherein $R_1$ to $R_{37}$, which may be the same or different, each represents a hydrogen atom, a straight-chain, branched or cyclic alkyl group, a straight-chain or cyclic alkoxyl group, a hydroxyl group, a halogen atom or —S—$R_{38}$, wherein $R_{38}$ represents a straight-chain, branched or cyclic alkyl group or an aryl group, and two or more of $R_1$ to $R_{15}$, $R_{16}$ to $R_{27}$ or $R_{28}$ to $R_{37}$ may combine to form a ring containing one or two or more selected from the group consisting of a single bond, carbon, oxygen, sulfur and nitrogen; and $X^-$ represents an anion of benzenesulfonic acid, naphthalenesulfonic acid or anthracenesulfonic acid containing at least one selected from the group consisting of at least one fluorine atom, a straight-chain, branched or cyclic alkyl group substituted by at least one fluorine atom, a straight-chain, branched or cyclic alkoxyl group substituted by at least one fluorine atom, an acyl group substituted by at least one fluorine atom, an acyloxy group substituted by at least one fluorine atom, an alkyl or aryl sulfonyl group substituted by at least one fluorine atom, an alkyl or aryl sulfonyloxy group substituted by at least one fluorine atom, an alkyl or aryl sulfonylamino group substituted by at least one fluorine atom, an aryl group substituted by at least one fluorine atom, an aralkyl group substituted by at least one fluorine atom, and an alkoxycarbonyl group substituted by at least one fluorine atom;

(b) a resin containing a group which is decomposed by action of an acid to increase solubility in an alkali developing solution; and (c) a fluorine and/or silicon surfactant.

5. The positive-working X-ray resist composition according to claim 4, which further comprises (d) a low molecular weight dissolution inhibitive compound having a molecular weight of 3,000 or less which has a group decomposable with an acid and increases the rate of dissolution in the alkali developing solution by action of an acid.

6. The positive-working X-ray resist composition according to claim 4, further comprising an organic basic compound.

7. A positive-working electron beam resist composition comprising:

(a) a compound capable of generating an acid by irradiation of an electron beam selected from the group consisting of compounds represented by formulae (I) to (III):

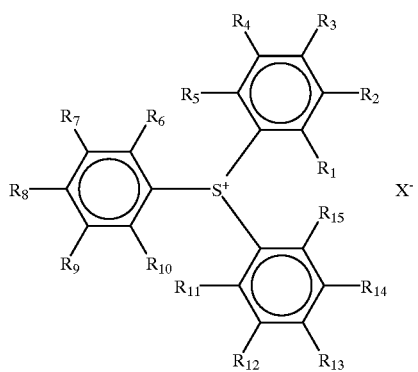

(I)

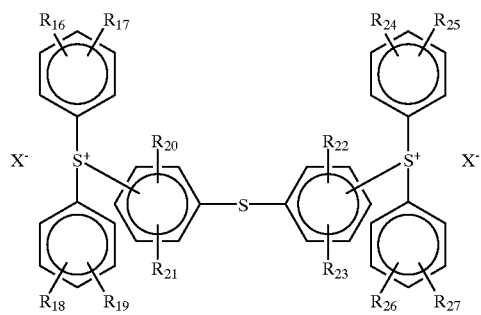

(II)

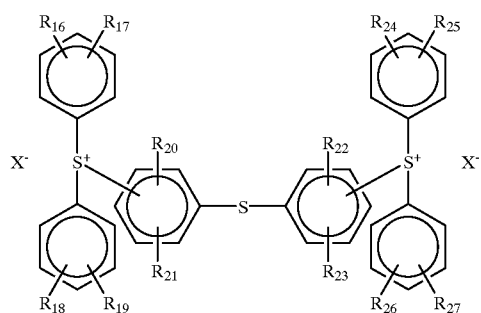

(II)

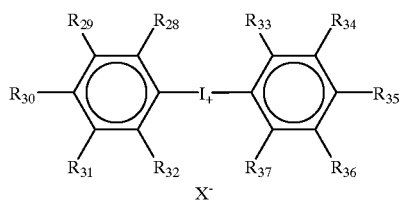

(III)

wherein $R_1$ to $R_{37}$, which may be the same or different, each represents a hydrogen atom, a straight-chain, branched or cyclic alkyl group, a straight-chain or cyclic alkoxyl group, a hydroxyl group, a halogen atom or —S—$R_{38}$, wherein $R_{38}$ represents a straight-chain, branched or cyclic alkyl group or an aryl group, and two or more of $R_1$ to $R_{15}$, $R_{16}$ to $R_{27}$ or $R_{28}$ to $R_{37}$ may combine to form a ring containing one or two or more selected from the group) consisting of a single bond, carbon, oxygen, sulfur and nitrogen; and $X^-$ represents an anion of benzenesulfonic acid, naphthalenesulfonic acid or anthracenesulfonic acid containing at least one selected from the group consisting of at least one fluorine atom, a straight-chain, branched or cyclic alkyl group substituted by at least one fluorine atom, a straight-chain, branched or cyclic alkoxyl group substituted by at least one fluorine atom, an acyl group substituted by at least one fluorine atom, an acyloxy group substituted by at least one fluorine atom, an alkyl or aryl sulfonyl group substituted by at least one fluorine atom, an alkyl or aryl sulfonyloxy group substituted by at least one fluorine atom, an alkyl or aryl sulfonylamino group substituted by at least one fluorine atom, an aryl croup substituted by at least one fluorine atom, an aralkyl group substituted by at least one fluorine atom, and an alkoxycarbonyl group substituted by at least one fluorine atom;

(c) a fluorine and/or silicon surfactant;

(d) a low molecular weight dissolution inhibitive compound having a molecular weight of 3,000 or less which has a group decomposable with an acid and increases the rate of dissolution in an alkali developing solution by action of the acid; and (e) a resin insoluble in water and soluble in the alkali developing solution.

8. The positive-working X-ray resist composition according to claim 7, further comprising an organic basic compound.

9. A positive-working X-ray resist composition comprising:

(a) a compound capable of generating an acid by irradiation of an X-ray selected from the group consisting of compounds represented by formulae (I) to (III):

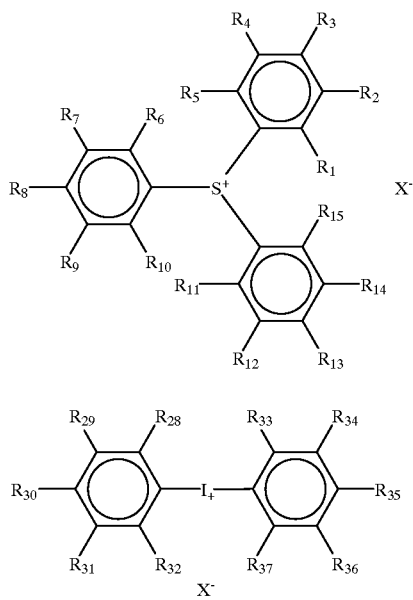

wherein $R_1$ to $R_{37}$, which may be the same or different, each represents a hydrogen atom, a straight-chain, branched or cyclic alkyl group, a straight-chain or cyclic alkoxyl group, a hydroxyl group, a halogen atom or —S—$R_{38}$, wherein $R_{38}$ represents a straight-chain, branched or cyclic alkyl group) or an aryl group, and two or more of $R_1$ to $R_{15}$, $R_{16}$ to $R_{27}$ or $R_{28}$ to $R_{37}$ may combine to form a ring containing one or two or more selected from the group consisting of a single bond, carbon, oxygen, sulfur and nitrogen; and $X^-$ represents an anion of benzenesulfonic acid, naphthalenesulfonic acid or anthracenesulfonic acid containing at least one selected from the group consisting of at least one fluorine atom, a straight-chain, branched or cyclic alkyl group substituted by at least one fluorine atom, a straight-chain, branched or cyclic alkoxyl group substituted by at least one fluorine atom, an acyl group substituted by at least one fluorine atom, an acyloxy group substituted by at least one fluorine atom, an alkyl or aryl sulfonyl group substituted by at least one fluorine atom, an alkyl or aryl sulfonyloxy group substituted by at least one fluorine atom, an alkyl or aryl sulfonylamino group substituted by at least one fluorine atom, an aryl group substituted by at least one fluorine atom, an aralkyl group substituted by at least one fluorine atom, and an alkoxycarbonyl group substituted by at least one fluorine atom;

(c) a fluorine and/or silicon surfactant;

(d) a low molecular weight dissolution inhibitive compound having a molecular weight of 3,000 or less which has a group decomposable with an acid and increases the rate of dissolution in an alkali developing solution by action of the acid; and (e) a resin insoluble in water and soluble in the alkali developing solution.

10. The positive-working X-ray resist composition according to claim 9, further comprising an organic basic compound.

* * * * *